US012720729B2

(12) United States Patent
Lee et al.

(10) Patent No.: US 12,720,729 B2
(45) Date of Patent: Aug. 25, 2026

(54) SEMICONDUCTOR DEVICE

(71) Applicant: SAMSUNG ELECTRONICS CO., LTD., Suwon-si (KR)

(72) Inventors: Do Keun Lee, Suwon-si (KR); Dong Wook Kim, Suwon-si (KR); Yang Doo Kim, Suwon-si (KR); Sang Wuk Park, Suwon-si (KR); Min Kyu Suh, Suwon-si (KR); Geon Yeop Lee, Suwon-si (KR); Jung Pyo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 18/236,435

(22) Filed: Aug. 22, 2023

(65) Prior Publication Data

US 2024/0164084 A1 May 16, 2024

(30) Foreign Application Priority Data

Nov. 10, 2022 (KR) ........................ 10-2022-0149299

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02)

(58) Field of Classification Search
CPC .... H10D 1/716; H10D 62/115; H10B 12/315; H10B 12/0335; H10B 12/033;
(Continued)

(56) References Cited

U.S. PATENT DOCUMENTS 6,762,110 B1 7/2004 Masuda
7,679,083 B2 3/2010 Sun et al.
(Continued)

FOREIGN PATENT DOCUMENTS

KR 10-2000-0005661 1/2000
KR 10-0753084 8/2007
(Continued)

OTHER PUBLICATIONS

Office Action dated Mar. 13, 2026 issued in the corresponding Korean Patent Application No. 10-2022-0149299. (Note: U.S. Pat. No. 9773790 B already submitted.).

*Primary Examiner* — Mouloucoulaye Inoussa
(74) *Attorney, Agent, or Firm* — MORGAN, LEWIS & BOCKIUS LLP

(57) ABSTRACT

A semiconductor device includes: a substrate includes an active area; a first landing pad connected to the active area and disposed on the substrate; a second landing pad connected to the active area, and spaced apart from the first landing pad, wherein the second landing pad is disposed on the substrate; a first lower electrode disposed on the first landing pad and extending in a direction substantially perpendicular to the substrate; a second lower electrode disposed on the second landing pad and extending in the direction substantially perpendicular to the substrate; a dielectric layer extending along the first lower electrode and the second lower electrode; and an upper electrode disposed on the dielectric layer, wherein a first upper surface of the first landing pad is disposed below a second upper surface of the second landing pad with respect to a lower surface of the substrate.

20 Claims, 39 Drawing Sheets

(58) Field of Classification Search
CPC ...... H10B 12/34; H10B 12/482; H10B 12/09; H10B 12/48; H10B 63/80; H10B 12/30; H10B 12/053; H10B 12/485; H10B 63/30; H01L 23/528; H01L 23/5226; H01L 21/76885; H01L 21/76886; H01L 21/76834; H01L 21/76837; H01L 21/76801; H01L 21/02126; H01L 21/76831; H01L 21/764; H01L 23/535; H01L 21/32139; H01L 23/5223; H01L 21/76832; H01L 21/76897; H01L 21/7682; H10N 70/231; H10N 70/011
See application file for complete search history.

(56) References Cited

U.S. PATENT DOCUMENTS 8,952,716 B2 2/2015 Cho et al.
9,040,414 B2 5/2015 Lee
9,773,790 B1* 9/2017 Ho ........................ H10B 12/053
11,043,498 B1* 6/2021 Han ...................... H10B 12/315
2010/0244191 A1 9/2010 Yu
2011/0147889 A1 6/2011 Tsuchiya
2013/0009226 A1* 1/2013 Park .................. H01L 21/76897 257/296
2015/0061134 A1* 3/2015 Lee ................... H01L 23/53209 257/751
2015/0108605 A1 4/2015 Park et al.
2015/0126013 A1* 5/2015 Hwang ................ H10B 12/315 438/672
2017/0103987 A1* 4/2017 Kim ...................... H10B 12/056
2018/0190657 A1* 7/2018 Chang ............... H01L 21/31116
2019/0074280 A1* 3/2019 Lin ........................ H10D 1/716
2019/0189617 A1* 6/2019 Kim ....................... H10D 1/716
2020/0013668 A1* 1/2020 Choi .................... H10B 12/315
2020/0365537 A1* 11/2020 Choi .................... H10B 12/315
2020/0395363 A1* 12/2020 Kim .................. H01L 21/76897
2021/0043722 A1* 2/2021 Cho ....................... H10B 12/00
2021/0134809 A1* 5/2021 Son ................... H01L 21/02164
2021/0272959 A1* 9/2021 Kim ....................... H10D 1/692
2021/0408007 A1* 12/2021 Ishigami .............. H10B 12/482
2022/0028860 A1* 1/2022 Choi .................... H10B 12/053
2022/0037254 A1* 2/2022 Choi ..................... H01L 23/528
2022/0051992 A1* 2/2022 Hsu ..................... H01L 23/5221
2022/0085024 A1* 3/2022 Li ........................ H10B 12/033
2022/0139921 A1* 5/2022 Kim ...................... H01L 23/528
2022/0238637 A1* 7/2022 Wu ........................ H10D 1/043
2022/0262721 A1* 8/2022 Choi .................... H10B 12/482
2022/0336365 A1* 10/2022 Lee ................... H01L 21/76858
2023/0035899 A1* 2/2023 Lee ...................... H10B 12/485
2023/0044856 A1* 2/2023 Park ..................... H10B 12/315
2023/0112600 A1* 4/2023 Yun ...................... H10B 12/033 257/296
2023/0171943 A1* 6/2023 Yang .................. H10B 12/0335 257/296

FOREIGN PATENT DOCUMENTS

KR 10-2010-0107608 A 10/2010
KR 10-2015-0043932 A 4/2015
KR 10-2021-0117794 9/2021

* cited by examiner

SEMICONDUCTOR DEVICE

CROSS-REFERENCE TO RELATED APPLICATION

This application claims priority under 35 USC § 119 to Korean Patent Application No. 10-2022-0149299, filed on Nov. 10, 2022, in the Korean Intellectual Property Office, the disclosure of which is incorporated by reference herein in its entirety.

TECHNICAL FIELD

The present inventive concept relates to a semiconductor device.

DISCUSSION OF THE RELATED ART

Recently, as semiconductor devices have become larger in storage capacity and more highly integrated, design rules have been continuously reduced. This trend is also noticeable in dynamic random access memory (DRAM) which is one of the memory semiconductor devices. Generally, for a DRAM device to operate, more than a certain level of capacitance is used for each cell.

To this end, research is being conducted on a method of utilizing a dielectric layer that has a high dielectric constant in a capacitor or a method increasing a contact area between a lower electrode of the capacitor and the dielectric layer. For example, when a height of the lower electrode is increased, the contact area between the capacitor and the dielectric layer may increase, thereby increasing the capacitance of the capacitor.

SUMMARY

According to an embodiment of the present inventive concept, a semiconductor device includes: a substrate includes an active area; a first landing pad connected to the active area and disposed on the substrate; a second landing pad connected to the active area, and spaced apart from the first landing pad, wherein the second landing pad is disposed on the substrate; a first lower electrode disposed on the first landing pad and extending in a direction substantially perpendicular to the substrate; a second lower electrode disposed on the second landing pad and extending in the direction substantially perpendicular to the substrate; a dielectric layer extending along the first lower electrode and the second lower electrode; and an upper electrode disposed on the dielectric layer, wherein a first upper surface of the first landing pad is disposed below a second upper surface of the second landing pad with respect to a lower surface of the substrate.

According to an embodiment of the present inventive concept, a semiconductor device includes: a substrate includes an active area; a first landing pad connected to the active area and disposed on the substrate; a second landing pad connected to the active area, and spaced apart from the first landing pad, wherein the second landing pad is disposed on the substrate; an insulating pattern disposed between the first landing pad and the second landing pad; a first lower electrode disposed on the first landing pad and extending in a direction substantially perpendicular to the substrate; a second lower electrode disposed on the second landing pad and extending in the direction substantially perpendicular to the substrate; a dielectric layer extending along the first lower electrode and the second lower electrode; and an upper electrode disposed on the dielectric layer, wherein the first landing pad and the second landing pad protrude above an upper surface of the insulating pattern with respect to a lower surface of the substrate, and the dielectric layer extends along portions of side surfaces of the first landing pad and the second landing pad that protrude above the upper surface of the insulating pattern.

According to an embodiment of the present inventive concept, a semiconductor device includes; a gate trench disposed in a substrate; a gate electrode filling a portion of the gate trench; a storage contact disposed on at least one side of the gate electrode and connected to the substrate; a first landing pad disposed on the storage contact; a second landing pad disposed on the storage contact and spaced apart from the first land pad; a first lower electrode disposed on the first landing pad and extending in a direction substantially perpendicular to the substrate; a second lower electrode disposed on the second landing pad and extending in the direction substantially perpendicular to the substrate; an insulating pattern disposed between the first landing pad and the second landing pad; an electrode support spaced apart from the insulating pattern, and disposed on a sidewall of the first lower electrode and a sidewall of the second lower electrode, wherein the electrode support supports the first lower electrode and the second lower electrode; a dielectric layer extending along the first lower electrode, the second lower electrode, the insulating pattern and the electrode support; and an upper electrode disposed on the dielectric layer, wherein an upper surface of the first landing pad and an upper surface of the second landing pad are at different heights from each other with respect to a lower surface of the substrate.

BRIEF DESCRIPTION OF THE DRAWINGS

The above and features of the present inventive concept will become more apparent by describing in detail embodiments thereof with reference to the attached drawings, in which:

FIGS. 16, 17, 18, 19, 20, 21, 22, 23, 24, 25, 26, 27, 28, and 29 are views illustrating intermediate steps of a method of manufacturing a semiconductor device according to an embodiment of the present inventive concept.

DETAILED DESCRIPTION OF THE EMBODIMENTS

Hereinafter, embodiments of the present inventive concept will be described with reference to the accompanying drawings.

Figure 1:
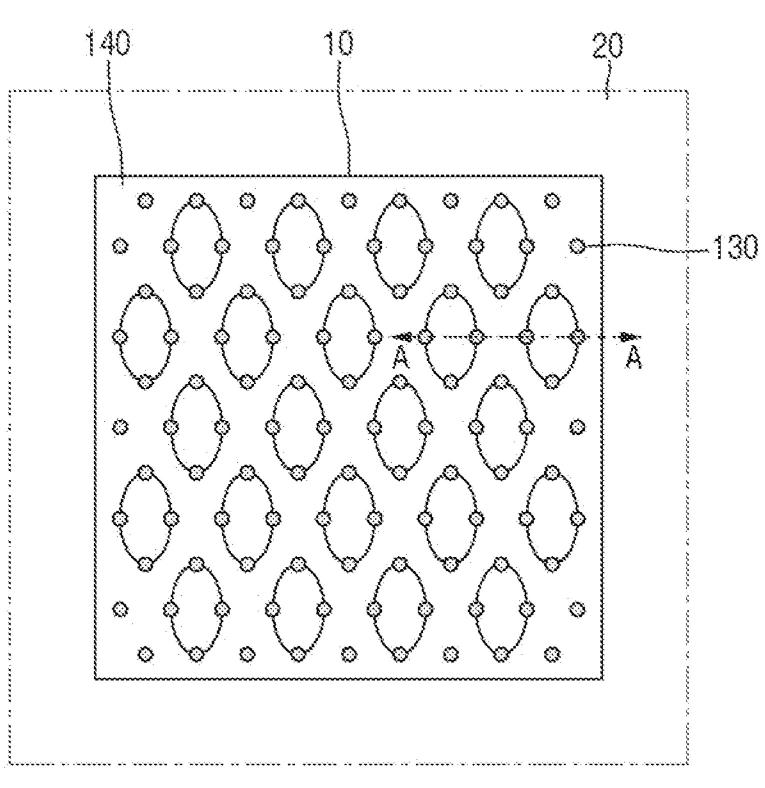
FIG. 1 is a plan view of a semiconductor device according to an embodiment of the present inventive concept.
Figure 1:
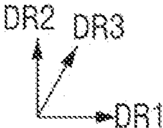
Figure 2:
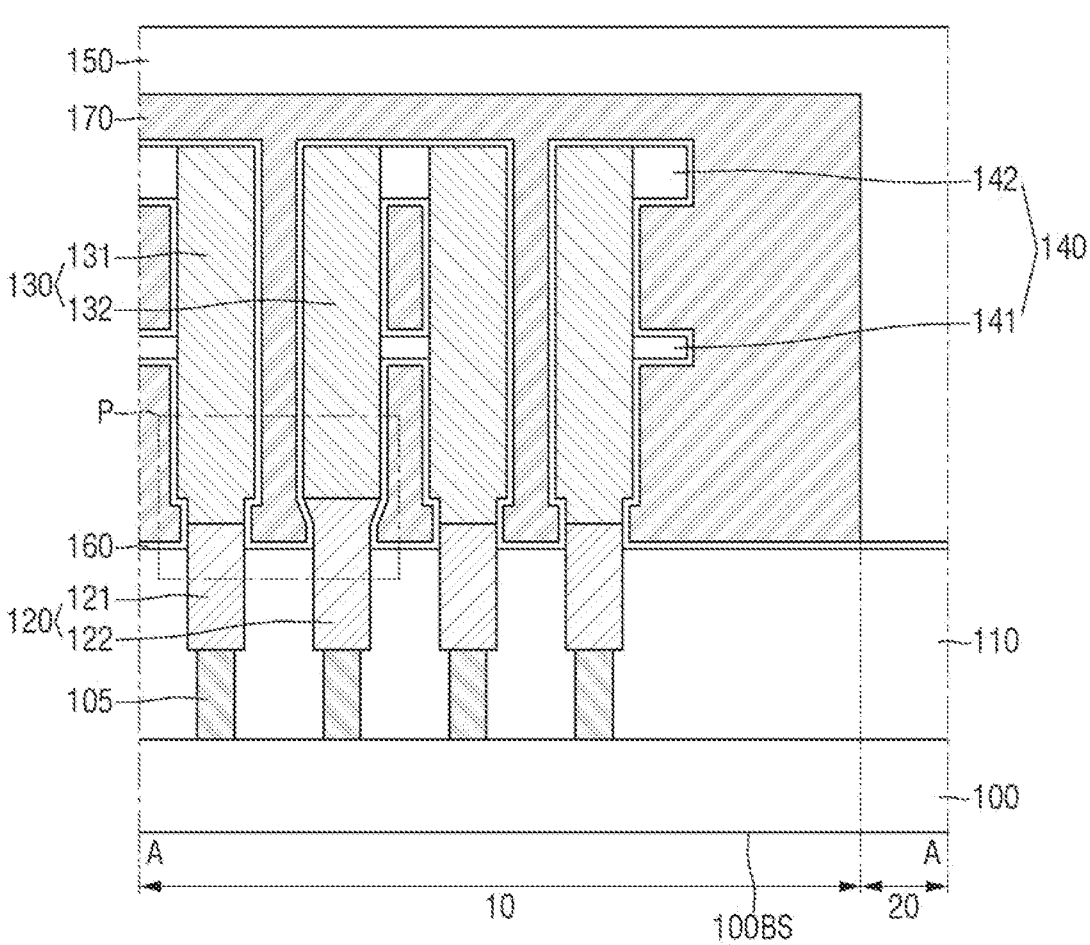
FIG. 2 is a cross-sectional view taken along line A-A of FIG. 1.
Figure 3:
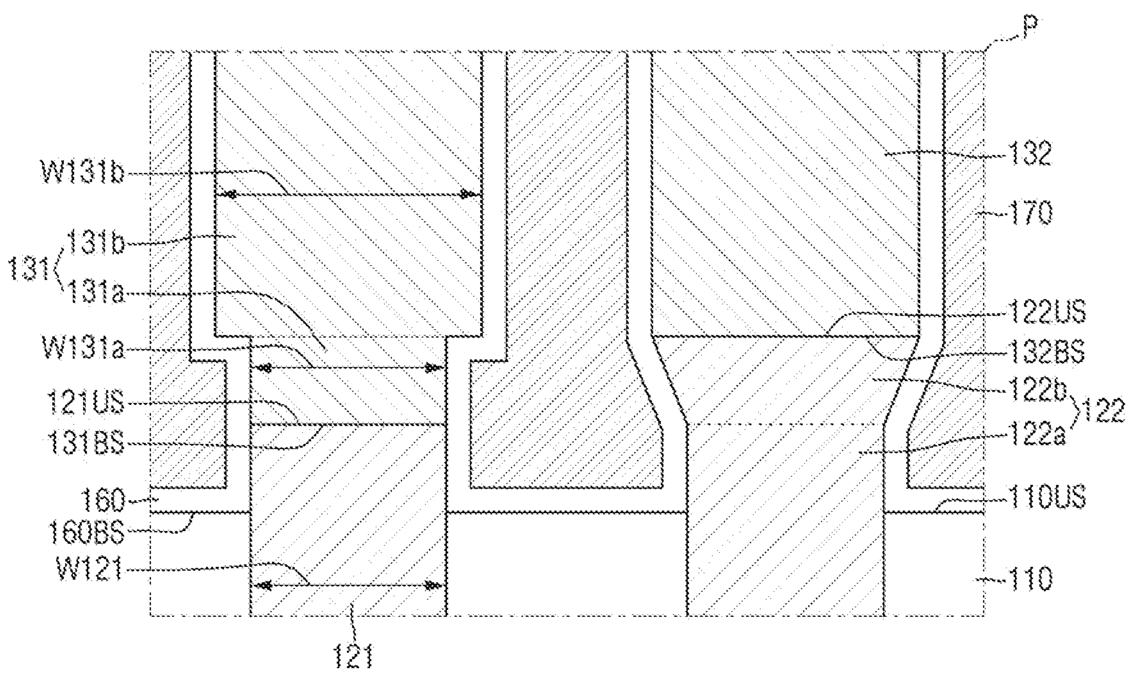
FIG. 3 is an enlarged view of portion P of FIG. 2.

FIG. 1 is a plan view of a semiconductor device according to an embodiment of the present inventive concept. FIG. 2 is a cross-sectional view taken along line A-A of FIG. 1. FIG. 3 is an enlarged view of portion P of FIG. 2.

Referring to FIGS. 1 through 3, the semiconductor device according to the embodiments of the present inventive concept may include a cell pattern area 10 and a peripheral area 20. The peripheral area 20 may at least partially surround the cell pattern area 10. The peripheral area 20 may be disposed between a plurality of cell pattern areas 10 that are repeatedly disposed. The peripheral area 20 may separate the cell pattern areas 10 that are repeatedly disposed.

The semiconductor device according to some embodiments of the present inventive concept may include a plurality of landing pads 120, a plurality of lower electrodes 130, an electrode support 140, a capacitor dielectric layer 160, and an upper electrode 170.

The landing pads 120 may be disposed on the substrate 100. The landing pads 120 may be connected to the substrate 100. The landing pads 120 may be spaced apart from each other by a first interlayer insulating layer 110. Side surfaces of the landing pads 120 may be at least partially surrounded by the first interlayer insulating layer 110.

The landing pads 120 may be electrically connected to conductive areas formed on or in the substrate 100. The landing pads 120 may be connected to the substrate 100 through storage contacts 105. The landing pads 120 may be disposed on the storage contacts 105.

The landing pads 120 may include a first landing pad 121 and a second landing pad 122. The first landing pad 121 and the second landing pad 122 may be spaced apart from each other. For example, the first landing pad 121 and the second landing pad 122 may be spaced apart from each other with the first interlayer insulating layer 110 interposed between them.

The first landing pad 121 and the second landing pad 122 may protrude above the first interlayer insulating layer 110. For example, an upper surface 121US of the first landing pad 121 may be disposed above an upper surface 110US of the first interlayer insulating layer 110. In addition, an upper surface 122US of the second landing pad 122 may be disposed above the upper surface 110US of the first interlayer insulating layer 110.

The upper surfaces 121US of the first landing pad 121 may be at a different height than the upper surface 122US of the second landing pad 122. For example, the upper surface 121US of the first landing pad 121 may be disposed below the upper surface 122US of the second landing pad 122 based on a lower surface 100BS of the substrate 100.

The second landing pad 122 may protrude more from the first interlayer insulating layer 110 than the first landing pad 121. For example, the upper surface 122US of the second landing pad 122 may be disposed above the upper surface 121US of the first landing pad 121 based on the lower surface 100BS of the substrate 100.

The second landing pad 122 may include an extension portion **122*a* and a connection portion 122*b*. The extension portion 122*a* may be disposed on a storage contact 105. The extension portion 122*a* may be connected to the storage contact 105. The extension portion 122*a* may contact the storage contact 105. The extension portion 122*a* may extend from the storage contact 105 in a direction substantially perpendicular to the substrate 100 to protrude above the upper surface 110US of the first interlayer insulating layer 110**.

The connection portion **122*b* may be disposed on the extension portion 122*a*. The connection portion 122*b* may be connected to the extension portion 122*a*. The connection portion 122*b* may contact the extension portion 122*a*. The connection portion 122*b* may be connected to a lower surface 132BS of a second lower electrode 132. For example, the connection portion 122*b* may directly contact a lower surface 132BS of a second lower electrode 132. The connection portion 122*b* may be disposed between the extension portion 122*a* and the second lower electrode 132. The connection portion 122*b* may connect the extension portion 122*a* and the second lower electrode 132** to each other.

The connection portion **122*b* might not have a constant width. For example, the connection portion 122*b* may become wider toward the second lower electrode 132. For example, the connecting portion 122*b* may have an inverted trapezoidal shape. As another example, the connecting portion 122*b*** may have a tapered shape.

Although the connecting portion **122*b* has an inverted trapezoidal shape in FIG. 3, embodiments of the present inventive concept are not limited thereto. For example, the connecting portion 122*b* may have a trapezoidal shape. For another example, the connecting portion 122*b* may have a constant width. That is, the connecting portion 122*b*** may have a rectangular shape.

The first interlayer insulating layer 110 may be disposed on the substrate 100. The storage contacts 105 and the landing pads 120 may be disposed in the first interlayer insulating layer 110 on the substrate 100.

The substrate 100 may be bulk silicon or silicon-on-insulator (SOI). In addition, as an example, the substrate 100 may be, but is not limited to, a silicon substrate or a substrate made of another material such as silicon germanium, silicon germanium on insulator (SGOI), indium antimonide, lead telluride, indium arsenide, indium phosphide, gallium arsenide, and/or gallium antimonide. In the following description, the substrate 100 will be described as a silicon substrate.

The first interlayer insulating layer 110 may include at least one of, for example, silicon oxide, silicon nitride, silicon oxynitride (SiON), silicon oxycarbonitride (SiOCN), and combinations thereof.

The storage contacts 105 may include at least one of, for example, a semiconductor material doped with impurities, a conductive silicide compound, a conductive metal nitride, and a metal. The landing pads 120 may include at least one of, for example, a semiconductor material doped with impurities, a conductive silicide compound, a conductive metal nitride, and a metal. In the semiconductor device according to some embodiments of the present inventive concept, the landing pads 120 may include tungsten (W).

The lower electrodes 130 may be disposed on the substrate 100. The lower electrodes 130 may be disposed on the landing pads 120. The lower electrodes 130 may be connected to the landing pads 120.

For example, each of the lower electrodes 130 may be shaped like a pillar or cylindrical shape. The lower electrodes 130 may extend in a thickness direction of the substrate 100. A length to which the lower electrodes 130 extend in the thickness direction of the substrate 100 is greater than a length to which the lower electrodes 130 extend in a direction DR1, DR2 or DR3 parallel to the substrate 100.

For example, the lower electrodes 130 may be repeatedly aligned along a first direction DR1 and a second direction DR2. The first direction DR1 and the second direction DR2 may be orthogonal to each other, but embodiments of the present inventive concept are not limited thereto. The lower electrodes 130 repeatedly aligned in the first direction DR1 may also be repeatedly aligned in the second direction DR2. The lower electrodes 130 repeatedly aligned in the second direction DR2 might not be linearly arranged along the second direction DR2. For example, the lower electrodes 130 repeatedly aligned in the second direction DR2 may be arranged in a zigzag pattern or with an alternating arrangement. The lower electrodes 130 may be linearly arranged along a third direction DR3.

As an example, the lower electrodes 130 may include, but not limited to, a doped semiconductor material, a conductive metal nitride (such as titanium nitride, tantalum nitride, niobium nitride or tungsten nitride), a metal (such as ruthenium, iridium, titanium or tantalum), and/or a conductive metal oxide (such as iridium oxide or niobium oxide). In the semiconductor device according to some embodiments of the present inventive concept, the lower electrodes 130 may include titanium nitride (TiN). In addition, in the semiconductor device according to some embodiments of the present inventive concept, the lower electrodes 130 may include niobium nitride (NbN).

The lower electrodes 130 may include a first lower electrode 131 and the second lower electrode 132. The first lower electrode 131 and the second lower electrode 132 may be spaced apart from each other. For example, the capacitor dielectric layer 160 and the upper electrode 170 may be disposed between the first lower electrode 131 and the second lower electrode 132. For another example, the capacitor dielectric layer 160, the electrode support 140, and the upper electrode 170 may be disposed between the first lower electrode 131 and the second lower electrode 132.

The first lower electrode 131 may be disposed on the first landing pad 121. The second lower electrode 132 may be disposed on the second landing pad 122.

A lower surface 131BS of the first lower electrode 131 may be at a different height than the lower surface 132BS of the second lower electrode 132. For example, a lower surface 131BS of the first lower electrode 131 may be disposed below the lower surface 132BS of the second lower electrode 132 based on the lower surface 100BS of the substrate 100.

The first lower electrode 131 may include a first portion 131*a* and a second portion 131*b*. The first portion 131*a* may be disposed on the first landing pad 121. For example, the first portion 131*a* may directly contact the first landing pad 121. The second portion 131*b* may be disposed on the first portion 131*a*. For example, the second portion 131*b* may be directly connected to the first portion 131*a*.

For example, the first portion 131*a* may be disposed below the lower surface 132BS of the second lower electrode 132. The second portion 131*b* may be disposed above the lower surface 132BS of the second lower electrode 132. For example, a boundary between the first portion 131*a* and the second portion 131*b* of the first lower electrode 131 may lie in the same plane as the lower surface 132BS of the second lower electrode 132. However, embodiments of the present inventive concept are not limited thereto. For example, the boundary between the first portion 131*a* and the second portion 131*b* of the first lower electrode 131 may also be disposed above the lower surface 132BS of the second lower electrode 132. In an embodiment of the present inventive concept, the boundary between the first portion 131*a* and the second portion 131*b* of the first lower electrode 131 may be disposed below the lower surface 132BS of the second lower electrode 132.

Widths of the first portion 131*a* and the second portion 131*b* may be different from each other. For example, a width W131*a* of the first portion 131*a* may be smaller than a width W131*b* of the second portion 131*b*.

The width W131*a* of the first portion 131*a* of the first lower electrode 131 may be equal to a width W121 of the first landing pad 121. The width W131*b* of the second portion 131*b* may be greater than the width W121 of the first landing pad 121.

The first lower electrode 131 might not have a constant width. For example, the first lower electrode 131 may have a first width at a first point. The first lower electrode 131 may have a second width greater than the first width at a second point. In this case, the first point may be disposed below the second point based on the lower surface 100BS of the substrate 100. For example, the first point may be included in the first portion 131*a* of the first lower electrode 131. The second point may be included in the second portion 131*b* of the first lower electrode 131.

Although the width W131*b* of the second portion 131*b* of the first lower electrode 131 is greater than the width W121 of the first landing pad 121 in FIG. 3, embodiments of the present inventive concept are not limited thereto. For example, the width W131*b* of the second portion 131*b* of the first lower electrode 131 may be equal to the width W121 of the first landing pad 121. In addition, although a width of the second lower electrode 132 is greater than a width of the extension portion 122*a* of the second landing pad 122 in FIG. 3, embodiments of the present inventive concept are not limited thereto. For example, the width of the second lower electrode 132 may be equal to the width of the extension portion 122*a* of the second landing pad 122. For another example, the width of the second lower electrode 132 may be smaller than the width of the extension portion 122*a* of the second landing pad 122.

The electrode support 140 may include a first support 141 and a second support 142. The electrode support 140 may be spaced apart from the first interlayer insulating layer 110 and the landing pads 120.

The first support 141 may be disposed on the first interlayer insulating layer 110. The first support 141 may be spaced apart from the first interlayer insulating layer 110. The first support 141 may be disposed between adjacent lower electrodes 130. For example, the first support 141 may contact the lower electrodes 130.

The second support 142 may be disposed on the first support 141. The second support 142 may be spaced apart from the first support 141. The second support 142 may be disposed between adjacent lower electrodes 130. For example, the second support 142 may contact the lower electrodes 130. For example, the upper electrode 170 and the dielectric layer 160 may be disposed between the first support 141 and the second support 142.

The first support 141 and the second support 142 may include an insulating material, for example, at least one of silicon nitride, silicon carbonitride, silicon boron nitride, silicon oxycarbide, silicon oxynitride, silicon oxide, and/or silicon oxycarbonitride.

The capacitor dielectric layer 160 may be formed on the lower electrodes 130, the first interlayer insulating layer 110, the landing pads 120, the first support 141, and the second support 142. The capacitor dielectric layer 160 may extend along the profile of the lower electrodes 130. The capacitor dielectric layer 160 may extend along upper and lower surfaces of the first support 141 and upper and lower surfaces of the second support 142.

The capacitor dielectric layer 160 may extend along a portion of each of the side surfaces of the landing pads 120. For example, the capacitor dielectric layer 160 may extend along the side surfaces of the landing pads 120 which protrude above the upper surface 110US of the first interlayer insulating layer 110. For example, the capacitor dielectric layer 160 may extend along side surfaces of the first landing pad 121 which protrude above the upper surface 110US of the first interlayer insulating layer 110. In addition, the capacitor dielectric layer 160 may extend along side surfaces of the second landing pad 122 which protrude above the upper surface 110US of the first interlayer insulating layer 110.

The capacitor dielectric layer 160 may extend along the first interlayer insulating layer 110. For example, the capacitor dielectric layer 160 may extend along the upper surface 110US of the first interlayer insulating layer 110 between the landing pads 120. For example, the capacitor dielectric layer 160 may directly contact the upper surface 110US of the first interlayer insulating layer 110.

A lowermost surface 160BS of the capacitor dielectric layer 160 may be disposed below upper surfaces of the landing pads 120. For example, the lowermost surface 160BS of the capacitor dielectric layer 160 may be disposed below the upper surface 121US of the first landing pad 121 based on the lower surface 100BS of the substrate 100. In addition, the lowermost surface 160BS of the capacitor dielectric layer 160 may be disposed below the upper surface 122US of the second landing pad 122 based on the lower surface 100BS of the substrate 100.

The lowermost surface 160BS of the capacitor dielectric layer 160 may be disposed below lower surfaces of the lower electrodes 130. For example, the lowermost surface 160BS of the capacitor dielectric layer 160 may be disposed below the lower surface 131BS of the first lower electrode 131 based on the lower surface 100BS of the substrate 100. In addition, the lowermost surface 160BS of the capacitor dielectric layer 160 may be disposed below the lower surface 132BS of the second lower electrode 132 based on the lower surface 100BS of the substrate 100.

The capacitor dielectric layer 160 may include, for example, silicon oxide, silicon nitride, silicon oxynitride, or a high-k material containing a metal. Although the capacitor dielectric layer 160 is illustrated as a single layer, this is only an example used for ease of description, and embodiments are not limited to this example.

In the semiconductor device according to some embodiments of the present inventive concept, the capacitor dielectric layer 160 may include a structure in which zirconium oxide, aluminum oxide, and zirconium oxide are sequentially stacked.

In the semiconductor device according to some embodiments of the present inventive concept, the capacitor dielectric layer 160 may include a dielectric layer including hafnium (Hf). In the semiconductor device according to some embodiments of the present inventive concept, the capacitor dielectric layer 160 may have a stacked structure of a ferroelectric material layer and a paraelectric material layer.

The ferroelectric material layer may have ferroelectric properties. The ferroelectric material layer may be thick enough to have ferroelectric properties. The thickness range of the ferroelectric material layer having ferroelectric properties may vary according to a ferroelectric material.

For example, the ferroelectric material layer may include a monometal oxide. The ferroelectric material layer may include a monometal oxide layer. Here, the monometal oxide may be a binary compound composed of one metal and oxygen. The ferroelectric material layer including the monometal oxide may have an orthorhombic crystal system.

In an example, the metal included in the monometal oxide layer may be hafnium (Hf). The monometal oxide layer may be a hafnium oxide (HfO) layer. Here, the hafnium oxide layer may have a chemical formula that conforms to stoichiometry or may have a chemical formula that does not conform to stoichiometry.

In another example, the metal included in the monometal oxide layer may be one of rare earth metals belonging to lanthanoids. The monometal oxide layer may be a rare earth metal oxide layer belonging to lanthanoids. Here, the rare earth metal oxide layer belonging to lanthanoids may have a chemical formula that conforms to stoichiometry or may have a chemical formula that does not conform to stoichiometry. When the ferroelectric material layer includes the monometal oxide layer, it may have a thickness of, e.g., about 1 to about 10 nm.

For example, the ferroelectric material layer may include a bimetal oxide. The ferroelectric material layer may include a bimetal oxide layer. Here, the bimetal oxide may be a ternary compound composed of two metals and oxygen. The ferroelectric material layer including the bimetal oxide may have an orthorhombic crystal system.

The metals included in the bimetal oxide layer may be, for example, hafnium (Hf) and zirconium (Zr). The bimetal oxide layer may be a hafnium zirconium oxide layer ($Hf_xZr_{(1-x)}O$). In the bimetal oxide layer, x may be 0.2 to 0.8. Here, the hafnium zirconium oxide layer ($Hf_xZr_{(1-x)}O$) may have a chemical formula that conforms to stoichiometry or may have a chemical formula that does not conform to stoichiometry.

When the ferroelectric material layer includes the bimetal oxide layer, it may have a thickness of, e.g., about 1 to about 20 nm.

For example, the paraelectric material layer may be, but is not limited to, a dielectric layer including zirconium (Zr) or a stacked layer including zirconium (Zr). Even if the chemical formula is the same, ferroelectric properties or paraelectric properties may be exhibited depending on the crystal structure of a dielectric material.

A paraelectric material may have a positive dielectric constant, and a ferroelectric material may have a negative dielectric constant in a specific section. For example, the paraelectric material may have a positive capacitance, and the ferroelectric material may have a negative capacitance.

Generally, when two or more capacitors having a positive capacitance are connected in series, the sum of the capacitances decreases. However, when a capacitor having a negative capacitance and a capacitor having a positive capacitance are connected in series, the sum of the capacitances increases.

The upper electrode 170 may be disposed on the capacitor dielectric layer 160. The upper electrode 170 may extend along the profile of the capacitor dielectric layer 160. For example, the upper electrode 170 may include, but not limited to, a doped semiconductor material, a conductive metal nitride (such as titanium nitride, tantalum nitride, niobium nitride or tungsten nitride), a metal (such as ruthenium, iridium, titanium or tantalum), or a conductive metal oxide (such as iridium oxide or niobium oxide). In the semiconductor device according to some embodiments of the present inventive concept, the upper electrode 170 may include titanium nitride (TiN). In addition, in the semiconductor device according to some embodiments of the present inventive concept, the upper electrode 170 may include niobium nitride (NbN).

A second interlayer insulating layer 150 may be disposed on the upper electrode 170. The second interlayer insulating layer 150 may cover both an upper surface and sidewalls of the upper electrode 170. In the peripheral area 20, the second interlayer insulating layer 150 may be disposed on the first interlayer insulating layer 110 and the capacitor dielectric layer 160.

The second interlayer insulating layer 150 may include at least one of, for example, silicon oxide, silicon nitride, silicon oxynitride (SiON), silicon oxycarbonitride (SiOCN), and combinations thereof.

Although the capacitor dielectric layer 160 extends to the peripheral area 20 in FIG. 2, embodiments of the present inventive concept are not limited thereto. For example, the capacitor dielectric layer 160 may be disposed only in the cell pattern area 10. Unlike in FIG. 2, the capacitor dielectric layer 160 may be disposed only under the upper electrode 170 in the cell pattern area 10. For example, the capacitor dielectric layer 160 might not be disposed in the peripheral area 20. In this case, the second interlayer insulating layer 150 may be disposed on the first interlayer insulating layer 110 in the peripheral area 20.

Figure 4:
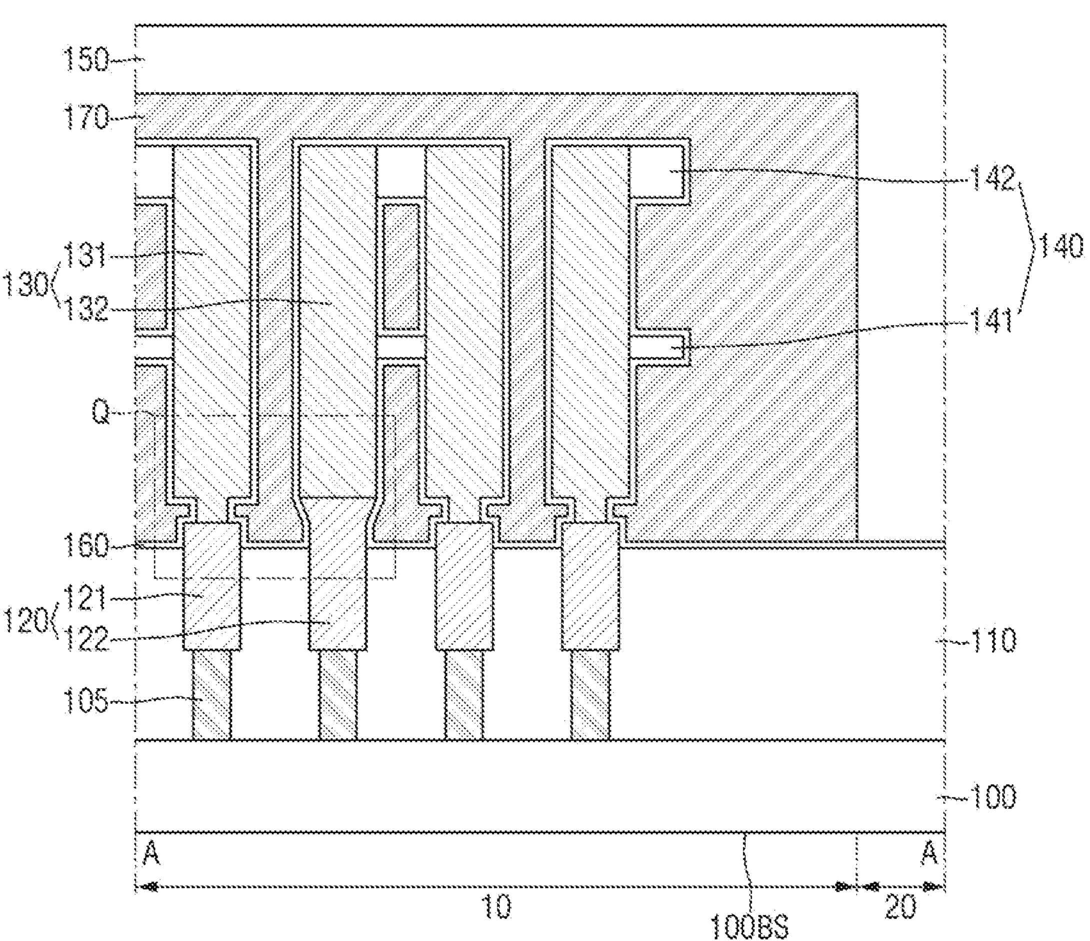
FIG. 4 illustrates a semiconductor device according to an embodiment of the present inventive concept.
Figure 5:
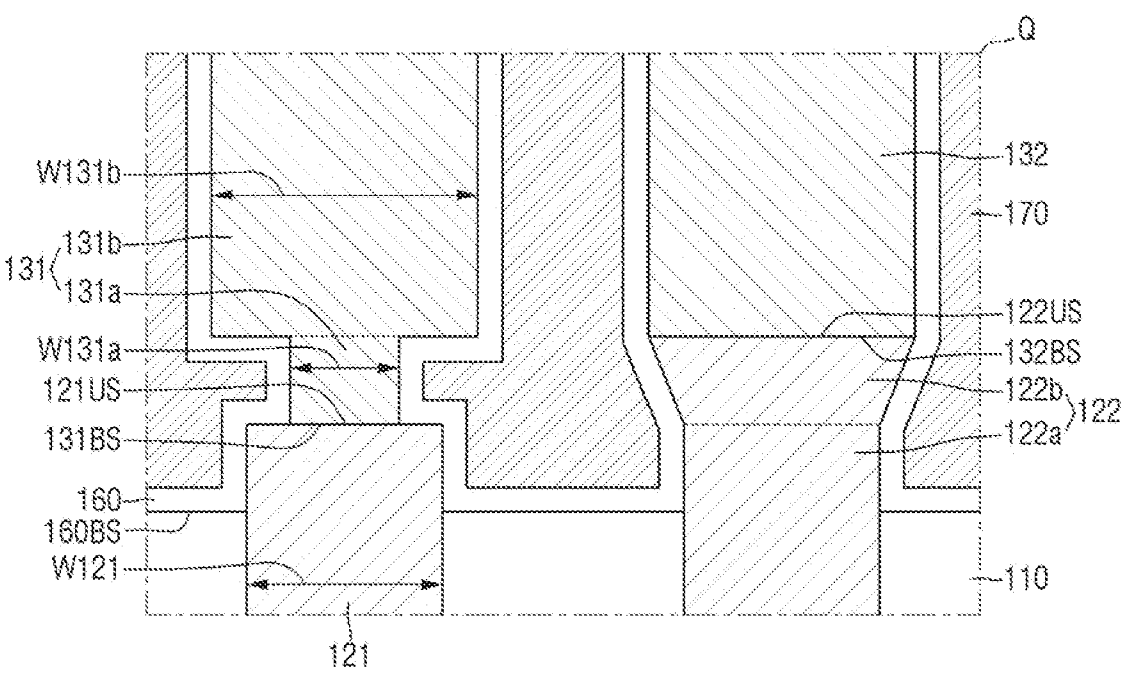
FIG. 5 is an enlarged view of portion Q of FIG. 4.

FIG. 4 illustrates a semiconductor device according to an embodiment of the present inventive concept. FIG. 5 is an enlarged view of portion Q of FIG. 4. For ease of description, the following description will focus on differences from the semiconductor device described above with reference to FIGS. 1 through 3. Accordingly, repetitive descriptions may be omitted or briefly discussed.

Referring to FIGS. 4 and 5, in the semiconductor device according to some embodiments of the present inventive concept, a width W131*a* of a first portion 131*a* of a first lower electrode 131 may be smaller than a width W121 of a first landing pad 121.

A capacitor dielectric layer 160 may extend between the first landing pad 121 and a second portion 131*b* of the first lower electrode 131. For example, the capacitor dielectric layer 160 between the first landing pad 121 and the second portion 131*b* may extend along side surfaces of the first portion 131*a*, a lower surface of the second portion 131*b*, and an upper surface 121US of the first landing pad 121.

Figure 6:
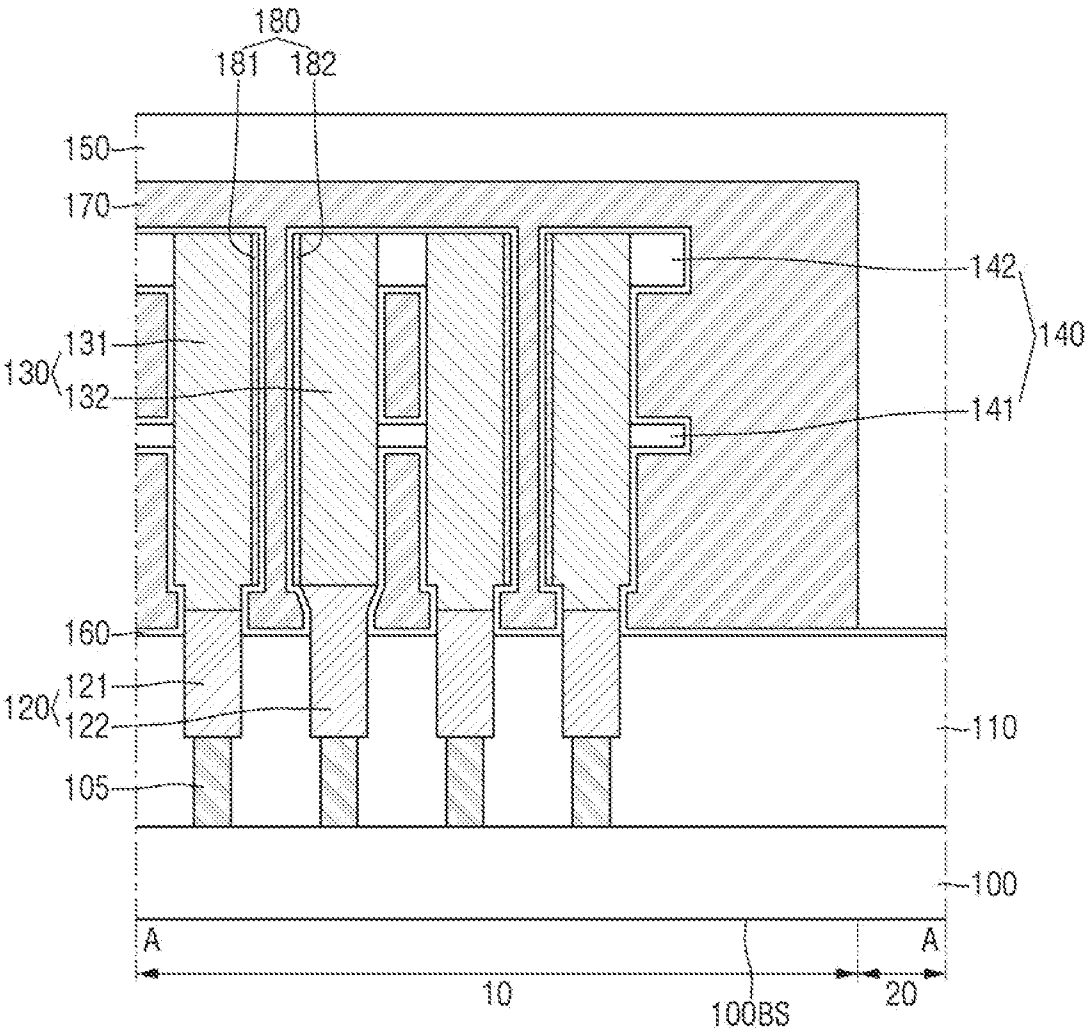
FIG. 6 illustrates a semiconductor device according to an embodiment of the present inventive concept.

FIG. 6 illustrates a semiconductor device according to an embodiment of the present inventive concept. For ease of description, the following description will focus on differences from the semiconductor devices described above with reference to FIGS. 1 through 5. Accordingly, repetitive descriptions may be omitted or briefly discussed.

Referring to FIG. 6, the semiconductor device according to the present embodiment of the present inventive concept may include a sidewall liner 180. The sidewall liner 180 may include a first liner 181 and a second liner 182.

The first liner 181 may extend along a sidewall of a first lower electrode 131. The second liner 182 may extend along a sidewall of a second lower electrode 132. An electrode support 140 might not be disposed between the first liner 181 and the second liner 182. For example, the electrode support 140 might not be disposed between the first lower electrode 131, on which the first liner 181 is disposed, and the second lower electrode 132, on which the second liner 182 is disposed.

The sidewall liner 180 may include the same material as that of a plurality of landing pads 120. The first liner 181 and the second liner 182 may include the same material as that of a second landing pad 122. For example, the first liner 181 and the second liner 182 may include tungsten (W).

Figure 7:
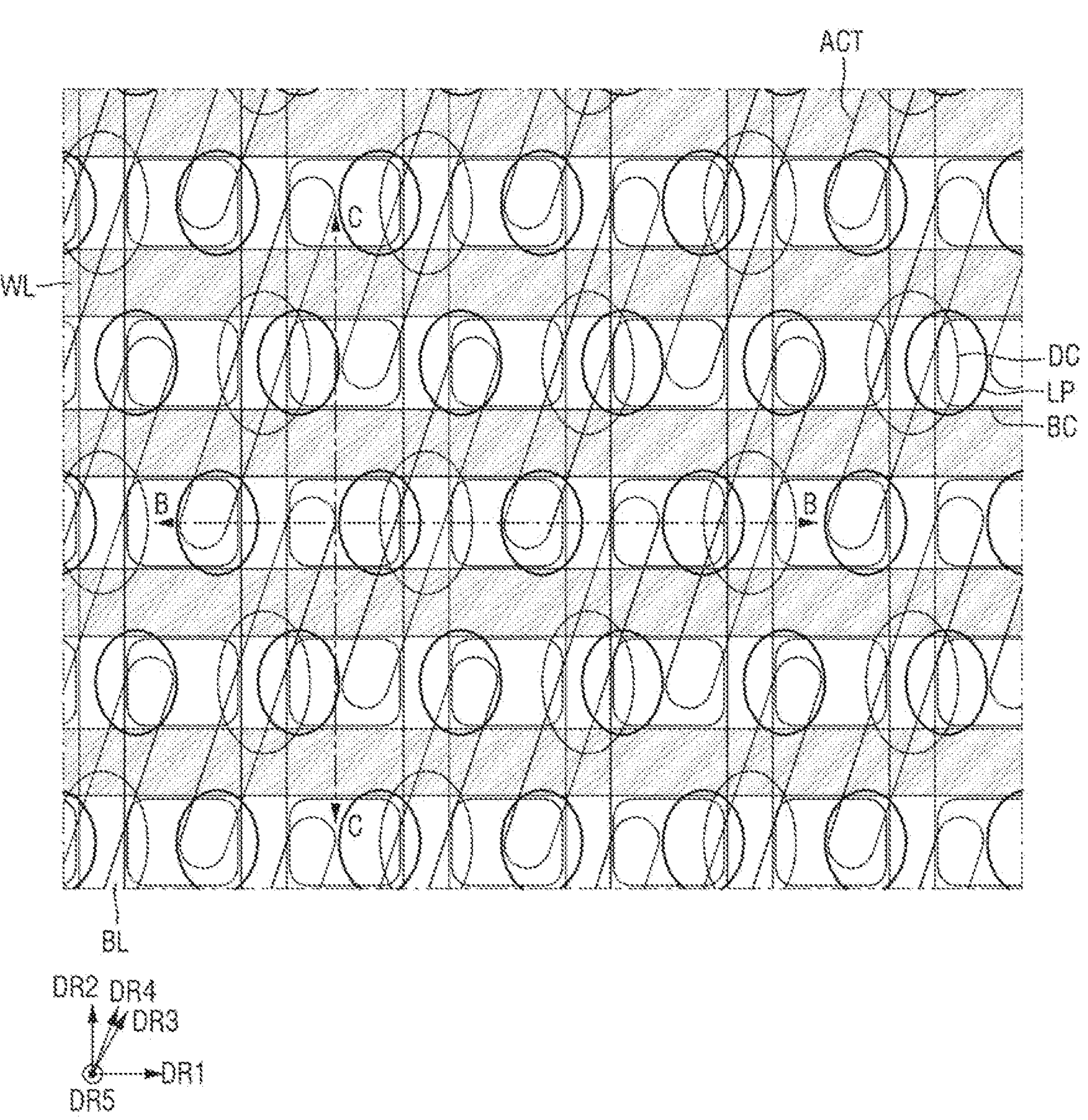
FIG. 7 is a schematic layout view of a semiconductor device according to an embodiment of the present inventive concept.
Figure 8:
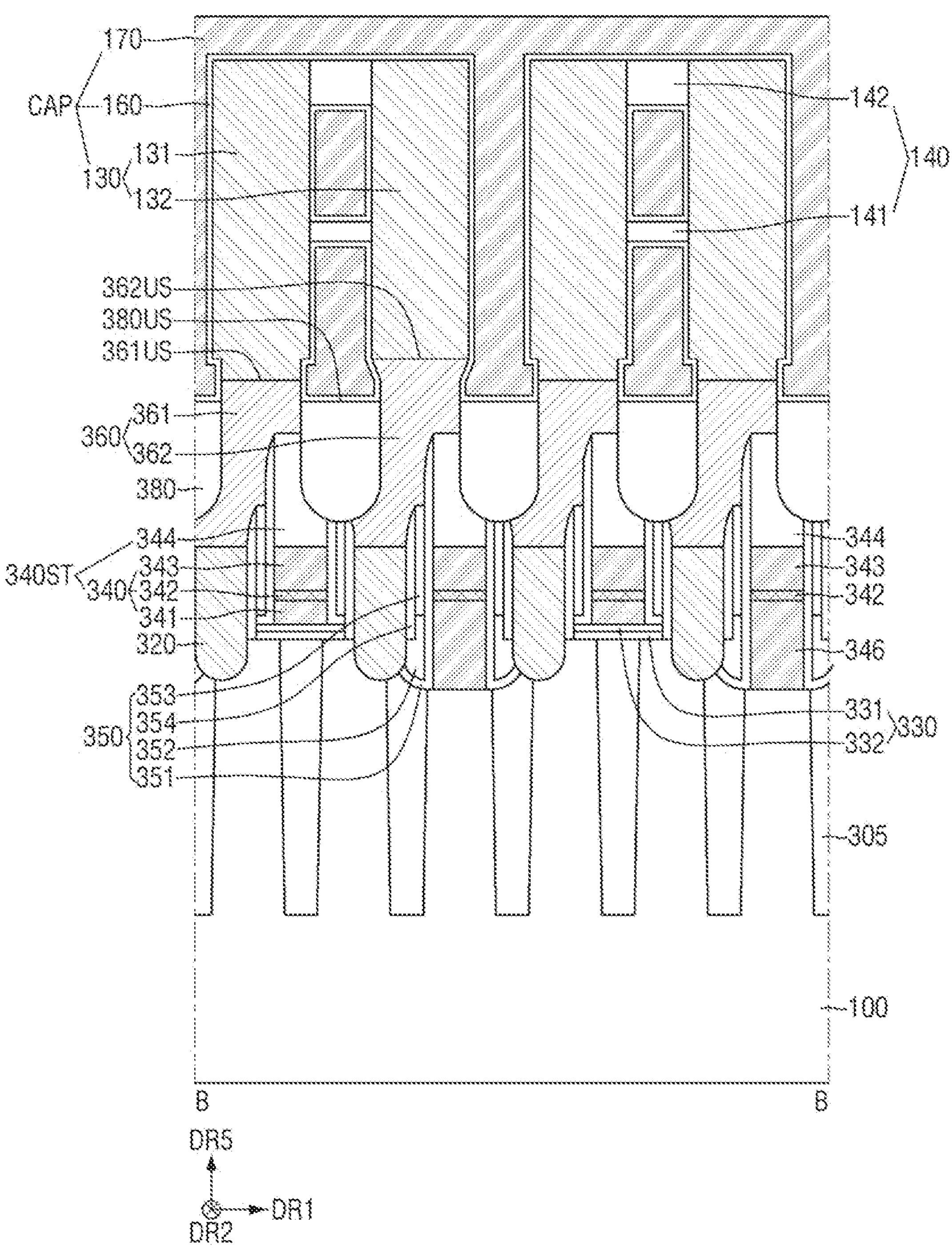
FIG. 8 is a cross-sectional view taken along line B-B of FIG. 7.
Figure 9:
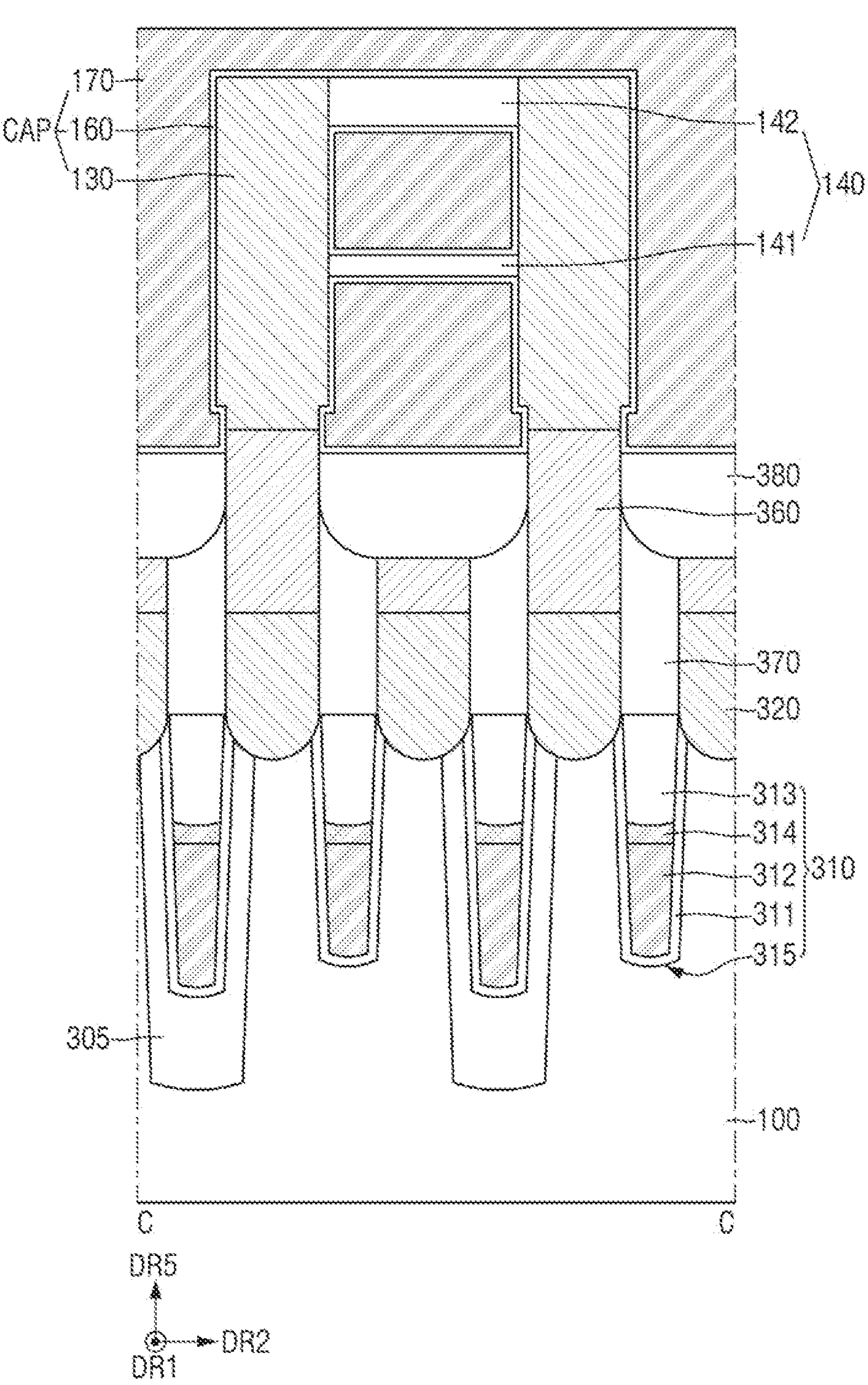
FIG. 9 is a cross-sectional view taken along line C-C of FIG. 7.

FIG. 7 is a schematic layout view of a semiconductor device according to an embodiment of the present inventive concept. FIG. 8 is a cross-sectional view taken along line B-B of FIG. 7. FIG. 9 is a cross-sectional view taken along line C-C of FIG. 7.

Although FIG. 7 illustrates an example layout view of a dynamic random access memory (DRAM) excluding a capacitor CAP, embodiments of the present inventive concept are not limited to this case. A first direction DR1 and a second direction DR2 of FIG. 7 may be the first direction DR1 and the second direction DR2 of FIG. 1. However, embodiments of the present inventive concept are not limited to this case. The first direction DR1 of FIG. 7 may also correspond to the second direction DR2 of FIG. 1, and the second direction DR2 of FIG. 7 may also correspond to the first direction DR1 of FIG. 1.

Referring to FIG. 7, the semiconductor device according to the present embodiment of the present inventive concept may include a plurality of active areas ACT. The active areas ACT may be defined by element isolation layers 305 (see FIG. 8) formed in a substrate 100 (see FIG. 8).

As design rules of the semiconductor device are reduced, the active areas ACT may be disposed in the shape of diagonal or oblique bars as illustrated in the drawing. The active areas ACT may be shaped like bars extending in a fourth direction DR4.

A plurality of gate electrodes may be disposed on the active areas ACT to cross the active areas ACT in the first direction DR1. The gate electrodes may extend parallel to each other. The gate electrodes may be, for example, a plurality of word lines WL.

The word lines WL may be disposed at substantially equal intervals. A width of each word line WL or a gap between the word lines WL may be determined according to the design rules.

A plurality of bit lines BL may be disposed on the word lines WL to extend in the second direction DR2 orthogonal to the word lines WL. The bit lines BL may extend parallel to each other.

The bit lines BL may be disposed at substantially equal intervals. A width of each bit line BL or a gap between the bit lines BL may be determined according to the design rules.

The semiconductor device according to the present embodiment may include various contact arrays formed on the active areas ACT. The various contact arrays may include, for example, direct contacts DC, buried contacts BC, and landing pads LP.

Here, the direct contacts DC may be contacts that electrically connect the active areas ACT to the bit lines BL. The buried contacts BC may be contacts that connect the active areas ACT to lower electrodes 130 (see FIG. 8) of the capacitor CAP (see FIG. 8).

Due to the arrangement structure, a contact area between each buried contact BC and a corresponding active area ACT may be relatively small. Accordingly, a conductive landing pad LP may be introduced to increase the contact area with the corresponding active area ACT and to increase a contact area with a corresponding lower electrode 130 (see FIG. 8) of the capacitor CAP.

The landing pad LP may be disposed between each buried contact BC and the corresponding active area ACT or between each buried contact BC and the corresponding lower electrode 130 of the capacitor CAP. The contact area increased by the introduction of the landing pad LP may reduce the contact resistance between each active area ACT and a corresponding lower electrode 130 of the capacitor CAP.

In the semiconductor device according to the present embodiment, each direct contact DC may be disposed in a central portion of a corresponding active area ACT. The buried contacts BC may be disposed at both ends of each active area ACT.

Since the buried contacts BC are disposed at both ends of each active area ACT, the landing pads LP may be disposed adjacent to both ends of each active area ACT to partially overlap the buried contacts BC.

In other words, each buried contact BC may be formed to overlap an active area ACT and an element isolation layer 305 (see FIG. 8) located between adjacent word lines WL and between adjacent bit lines BL.

The word lines WL may be buried in the substrate 100. The word lines WL may cross the active areas ACT between the direct contacts DC or the buried contacts BC.

As illustrated in the drawing, two word lines WL may cross one active area ACT. Since the active areas ACT are disposed obliquely, the word lines WL may be at an angle of less than about 90 degrees to the active areas ACT.

The direct contacts DC and the buried contacts BC may be disposed symmetrically. Therefore, the direct contacts DC and the buried contacts BC may lie on a straight line along the first direction DR1 and the second direction DR2.

Unlike the direct contacts DC and the buried contacts BC, the landing pads LP may be disposed in a zigzag pattern or alternating arrangement in the second direction DR2 in which the bit lines BL extend. In addition, the landing pads LP may be disposed to overlap the same side of each bit line BL in the first direction DR1 in which the word lines WL extend.

For example, each landing pad LP in a first line may overlap a left side of a corresponding bit line BL, and each landing pad LP in a second line may overlap a right side of the corresponding bit line BL.

Referring to FIGS. 7 through 9, the semiconductor device according to some embodiments of the present inventive concept may include gate structures 310, a plurality of bit line structures 340ST, storage contacts 320, and the capacitor CAP.

The element isolation layers 305 may be formed in the substrate 100. The element isolation layers 305 may have a shallow trench isolation (STI) structure having superior element isolation characteristics. The element isolation layers 305 may define the active areas ACT on the substrate 100.

Each of the active areas ACT defined by the element isolation layers 305 may be shaped like an island including a short axis and a long axis as illustrated in FIG. 7. The active areas ACT may have an oblique shape at an angle of less than about 90 degrees with respect to the word lines WL formed in the element isolation layers 305.

For example, each of the element isolation layers 305 may include, but not limited to, at least one of a silicon oxide layer, a silicon nitride layer, and a silicon oxynitride layer. Although each of the element isolation layers 305 is formed as one insulating layer in the drawings, this is only an example used for ease of description, and embodiments of the present inventive concept are not limited to this example. Each of the element isolation layers 305 may be formed as one insulating layer or as a plurality of insulating layers depending on the width of the element isolation layer 305.

In addition, the active areas ACT may have an oblique shape at an angle of less than about 90 degrees with respect to the bit lines BL formed on the element isolation layers 305. For example, the active area ACT may extend in the fourth direction DR4 having a predetermined angle with respect to the first direction DR1 and the second direction DR2.

The gate structures 310 may be formed in the substrate 100 and the element isolation layers 305. The gate structures 310 may be formed to cross the element isolation layers 305 and the active areas ACT defined by the element isolation layers 305. Each of the gate structures 310 may include a gate trench 315, a gate insulating layer 311, a gate electrode 312, agate capping pattern 313, and agate capping conductive layer 314. For example, the gate trench 315 may be formed in the substrate 100 and an element isolation layer 305. Here, the gate electrode 312 may correspond to a word line WL. Unlike in the drawings, each of the gate structures 310 might not include the gate capping conductive layer 314.

The gate insulating layer 311 may extend along sidewalls and a bottom surface of the gate trench 315. The gate insulating layer 311 may extend along the profile of at least a portion of the gate trench 315.

The gate insulating layer 311 may include, for example, at least one of silicon oxide, silicon nitride, silicon oxynitride, and a high-k material having a higher dielectric constant than the silicon oxide. The high-k material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The gate electrode 312 may be formed on the gate insulating layer 311. The gate electrode 312 may fill at least a portion of the gate trench 315. The gate capping conductive layer 314 may extend along an upper surface of the gate electrode 312.

The gate electrode 312 may include at least one of, for example, a metal, a metal alloy, a conductive metal nitride, a conductive metal carbonitride, a conductive metal carbide, a metal silicide, a doped semiconductor material, a conductive metal oxynitride, and a conductive metal oxide. The gate electrode 312 may include, but is not limited to, at least one of, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof. For example, the gate capping conductive layer 314 may include, but is not limited to, polysilicon or polysilicon germanium.

The gate capping pattern 313 may be disposed on the gate electrode 312 and the gate capping conductive layer 314. The gate capping pattern 313 may fill the gate trench 315 remaining after the gate electrode 312 and the gate capping conductive layer 314 are formed in the gate trench 315. Although the gate insulating layer 311 extends along sidewalls of the gate capping pattern 313 in the drawings, embodiments of the present inventive concept are not limited thereto. The gate capping pattern 313 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

For example, an impurity doped region may be formed on at least one side of each of the gate structures 310. The impurity doped region may be a source/drain region of a transistor.

Each of the bit line structures 340ST may include a cell conductive line 340 and a cell line capping layer 344. The cell conductive line 340 may be formed on the substrate 100 and the element isolation layers 305 in which the gate structures 310 are formed. The cell conductive line 340 may cross the element isolation layers 305 and the active areas ACT. The cell conductive line 340 may be formed to cross the gate structures 310. Here, the cell conductive line 340 may correspond to a bit line BL.

The cell conductive line 340 may be a multilayer. The cell conductive line 340 may include, for example, a first cell conductive layer 341, a second cell conductive layer 342, and a third cell conductive layer 343. The first through third cell conductive layers 341 through 343 may be sequentially stacked on the substrate 100 and the element isolation layers 305. Although the cell conductive line 340 is illustrated as a triple layer, embodiments of the present inventive concept are not limited thereto.

Each of the first through third cell conductive layers 341 through 343 may include, for example, at least one of a semiconductor material doped with impurities, a conductive silicide compound, a conductive metal nitride, a metal, and a metal alloy. For example, the first cell conductive layer 341 may include a doped semiconductor material, and the second cell conductive layer 342 may include at least one of a conductive silicide compound and/or a conductive metal nitride. For example, the third cell conductive layer 343 may include at least one of a metal and a metal alloy. However, embodiments of the present inventive concept are not limited thereto.

A bit line contact 346 may be formed between the cell conductive line 340 and the substrate 100. That is, the cell conductive line 340 may be formed on the bit line contact 346. For example, the bit line contact 346 may be formed between the substrate 100 and the second cell conductive layer 342. For example, the bit line contact 346 may be formed at a point where the cell conductive line 340 crosses a middle portion of an active area ACT shaped like an island.

The bit line contact 346 may electrically connect the cell conductive line 340 and the substrate 100 to each other. Here, the bit line contact 346 may correspond to a direct contact DC. The bit line contact 346 may include, for example, at least one of a semiconductor material doped with impurities, a conductive silicide compound, a conductive metal nitride, and/or a metal.

In FIG. 8, the cell conductive line 340 may include the second cell conductive layer 342 and the third cell conductive layer 343 in an area overlapping an upper surface of the bit line contact 346. The cell conductive line 340 may include the first through third cell conductive layers 341 through 343 in an area not overlapping the upper surface of the bit line contact 346.

The cell line capping layer 344 may be disposed on the cell conductive line 340. The cell line capping layer 344 may extend in the second direction DR2 along an upper surface of the cell conductive line 340. Here, the cell line capping layer 344 may include, for example, at least one of a silicon nitride layer, silicon oxynitride, silicon carbonitride, and silicon oxycarbonitride. In the semiconductor memory device according to some embodiments of the present inventive concept, the cell line capping layer 344 may include, for example, a silicon nitride layer. Although the cell line capping layer 344 is illustrated as a single layer, embodiments of the present inventive concept are not limited thereto. The cell line capping layer 344 may also be a multilayer. However, when layers constituting the multilayer are made of the same material, the cell line capping layer 344 may be a single layer.

A cell insulating layer 330 may be formed on the substrate 100 and an element isolation layer 305. For example, the cell insulating layer 330 may be formed on the substrate 100 and each element isolation layer 305 on which the bit line contact 346 is not formed. The cell insulating layer 330 may be formed between the substrate 100 and the cell conductive line 340 and between the element isolation layer 305 and the cell conductive line 340.

The cell insulating layer 330 may be a single layer. However, as illustrated in the drawings, the cell insulating layer 330 may also be a multilayer including a first cell insulating layer 331 and a second cell insulating layer 332. For example, the first cell insulating layer 331 may include a silicon oxide layer, and the second cell insulating layer 332 may include a silicon nitride layer, but embodiments of the present inventive concept are not limited thereto.

Cell line spacers 350 may be disposed on sidewalls of the cell conductive line 340 and the cell line capping layer 344. In a portion of the cell conductive line 340 in which the bit line contact 346 is formed, the cell line spacers 350 may be formed on the substrate 100 and the element isolation layer 305. The cell line spacers 350 may be disposed on the sidewalls of the cell conductive line 340, the cell line capping layer 344, and the bit line contact 346.

However, in the other portion of the cell conductive line 340 in which the bit line contact 346 is not formed, the cell line spacers 350 may be disposed on the cell insulating layer 330. The cell line spacers 350 may be disposed on the sidewalls of the cell conductive line 340 and the cell line capping layer 344.

Each of the cell line spacers 350 may be a single layer. However, as illustrated in the drawings, each of the cell line spacers 350 may also be a multilayer including first through fourth cell line spacers 351 through 354. For example, the first through fourth cell line spacers 351 through 354 may include, but are not limited to, at least one of a silicon oxide layer, a silicon nitride layer, a silicon oxynitride layer (SiON), a silicon oxycarbonitride layer (SiOCN), air, and combinations thereof.

For example, the second cell line spacer 352 might not be disposed on the cell insulating layer 330 but may be disposed on each sidewall of the bit line contact 346. On an upper surface of each gate structure 310, the fourth cell line spacer 354 may extend along the sidewalls of the cell conductive lines 340, which are adjacent to each other in the first direction DR1, and along an upper surface of the gate capping pattern 313. For example, the second cell line spacer 352 might not be disposed on the cell insulating layer 330 but may be disposed on each sidewall of the bit line contact 346.

Fence patterns 370 may be disposed on the substrate 100 and the element isolation layers 305. The fence patterns 370 may be formed to overlap the gate structures 310 formed in the substrate 100 and the element isolation layers 305. Each of the fence patterns 370 may be disposed between the bit line structures 340ST extending in the second direction DR2. The fence patterns 370 may include, for example, at least one of silicon oxide, silicon nitride, silicon oxynitride, and combinations thereof.

Each of the storage contacts 320 may be disposed between the bit lines BL that are adjacent to each other in the first direction DR1. For example, each of the storage contacts 320 may be disposed between the cell conductive lines 340 that are adjacent to each other in the first direction DR1. Each of the storage contacts 320 may be disposed between the fence patterns 370 that are adjacent to each other in the second direction DR2. Each of the storage contacts 320 may overlap the substrate 100 and the element isolation layer 305 between adjacent cell conductive lines 340. The storage contacts 320 may be connected to the active areas ACT. Here, the storage contacts 320 may correspond to the buried contacts BC. In addition, the storage contacts 320 may correspond to the storage contacts 105 of FIGS. 1 through 6.

The storage contacts 320 may include, for example, at least one of a semiconductor material doped with impurities, a conductive silicide compound, a conductive metal nitride, and a metal.

Landing pads 360 may be formed on the storage contacts 320. The landing pads 360 may be electrically connected to the storage contacts 320. The landing pads 360 may be connected to cell active areas. The landing pads 360 may correspond to the landing pads LP of FIG. 7. In addition, the landing pads 360 may correspond to the landing pads 120 of FIGS. 1 through 6.

The landing pads 360 may partially overlap upper surfaces of the bit line structures 340ST. The landing pads 360 may include, for example, at least one of a semiconductor material doped with impurities, a conductive silicide compound, a conductive metal nitride, a conductive metal carbide, a metal, and a metal alloy.

Pad separation insulating patterns 380 may be formed on the landing pads 360 and the bit line structures 340ST. For example, the pad separation insulating patterns 380 may be disposed on the cell line capping layers 344. The pad separation insulating patterns 380 may define the landing pads 360 that form a plurality of isolation areas. The pad separation insulating patterns 380 may correspond to the first interlayer insulating layer 110 of FIGS. 1 through 6.

The pad separation insulating patterns 380 might not cover upper surfaces of the landing pads 360. For example, the upper surface of each landing pad 360 may be at a higher height than an upper surface of each pad separation insulating pattern 380, with respect to an upper surface of the substrate 100.

The pad separation insulating patterns 380 may include an insulating material. The pad separation insulating patterns 380 may electrically separate the landing pads 360 from each other. For example, the pad separation insulating patterns 380 may include, for example, at least one of a silicon oxide layer, a silicon nitride layer, a silicon oxynitride layer, a silicon oxycarbonitride layer, and a silicon carbonitride layer.

The landing pads 360 may include a first landing pad 361 and a second landing pad 362. An upper surface of the second landing pad 362 may be higher than an upper surface of the first landing pad 361. For example, an upper surface 362US of the second landing pad 362 may be disposed above an upper surface 361US of the first landing pad 361 based on a lower surface of the substrate 100.

The first landing pad 361 and the second landing pad 362 may protrude above the pad separation insulating patterns 380. For example, the upper surface 361US of the first landing pad 361 and the upper surface 362US of the second landing pad 362 may be disposed above upper surfaces 380US of the pad separation insulating patterns 380 based on the lower surface of the substrate 100.

A capacitor dielectric layer 160 may extend along the upper surfaces 380US of the pad separation insulating patterns 380. For example, the capacitor dielectric layer 160 may directly contact the upper surfaces 380US of the pad separation insulating patterns 380. In addition, the capacitor dielectric layer 160 may extend along side surfaces of the landing pads 360 that are protruding above the upper surfaces 380US of the pad separation insulating patterns 380.

The capacitor CAP may be disposed on the landing pads 360. The capacitor CAP may be connected to the landing pads 360. For example, the capacitor CAP may be electrically connected to the storage contacts 320.

The capacitor CAP may include the lower electrodes 130, the capacitor dielectric layer 160, and an upper electrode 170. A first support 141 and a second support 142 supporting the lower electrodes 130 may be formed on the pad separation insulating patterns 380.

The landing pads 360 connected to the capacitor CAP, the lower electrodes 130, the capacitor dielectric layer 160 and the upper electrode 170 included in the capacitor CAP may be substantially the same as those above described with reference to FIGS. 1 through 6. For example, the upper surface of the second landing pad 362 may be disposed above the upper surface of the first landing pad 361. For another example, a lower surface of a first lower electrode 131 may be disposed below a lower surface of a second lower electrode 132.

Figure 10:
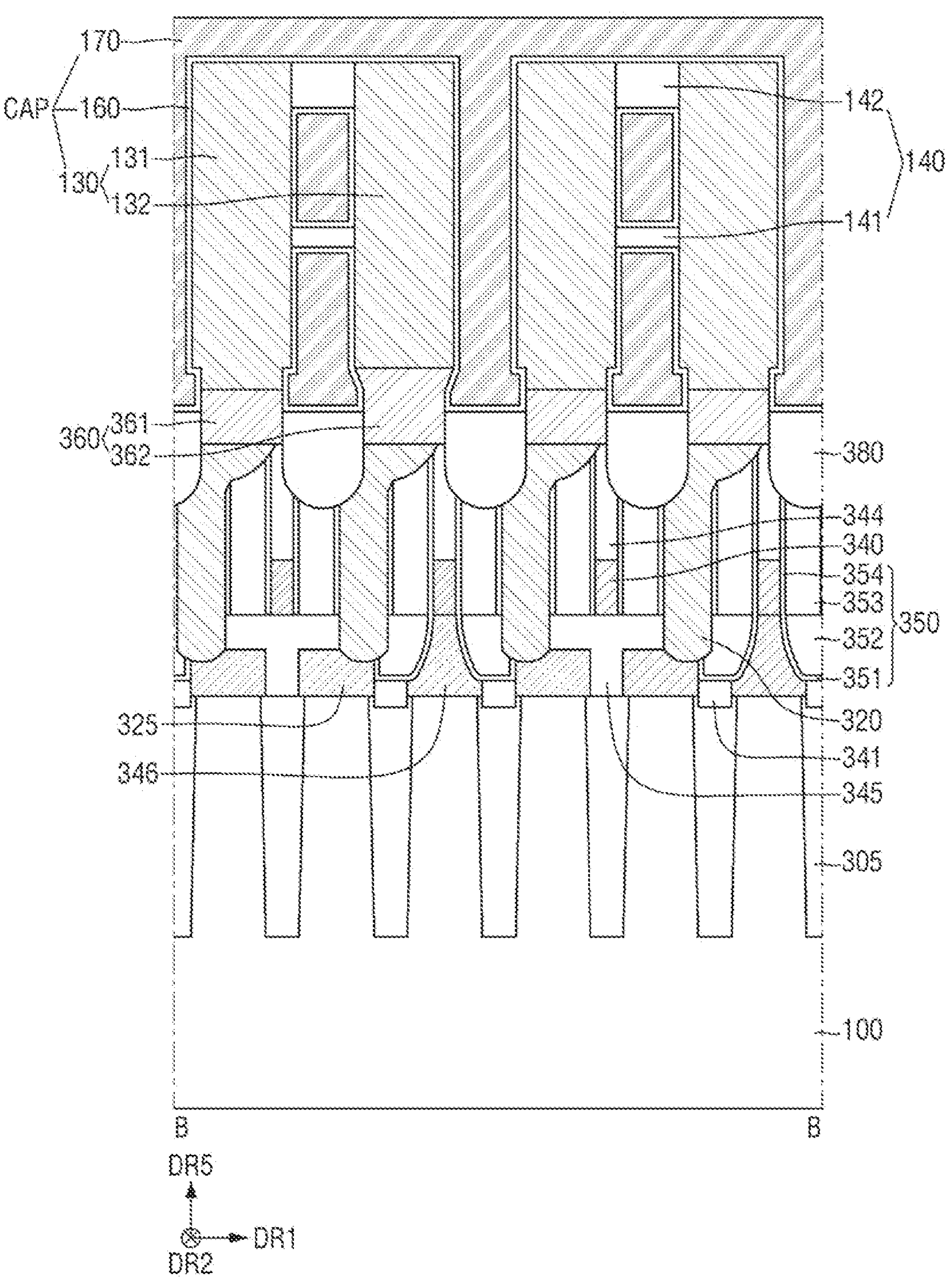
FIG. 10 illustrates a semiconductor device according to an embodiment of the present inventive concept.

FIG. 10 illustrates a semiconductor device according to an embodiment of the present inventive concept. For reference, FIG. 10 is a cross-sectional view taken along line B-B of FIG. 7. For ease of description, the following description will focus on differences from the semiconductor device described above with reference to FIGS. 7 through 9. Accordingly, repetitive descriptions may be omitted or briefly discussed.

Referring to FIG. 10, the semiconductor device according to the present embodiment may further include node pads 325.

Each bit line contact 346 includes an upper surface, which is connected to a cell conductive line 340, and a lower surface, which is connected to a cell active area of a substrate 100. A width of the upper surface of each bit line contact 346 in a first direction DR1 may be smaller than a width of the lower surface of each bit line contact 346 in the first direction DR1. The width of each bit line contact 346 may gradually increase as the distance from the cell conductive line 340 increases. For example, the bit line contacts 346 may gradually become wider from top to bottom.

The node pads 325 may be disposed on the substrate 100. The node pads 325 may be disposed on cell active areas. The node pads 325 may be disposed between the second storage contacts 320 and the substrate 100.

Upper surfaces of the node pads 325 may be lower than the upper surfaces of the bit line contacts 346 based on upper surfaces of element isolation layers 305. The upper surfaces of the node pads 325 may be lower than lower surfaces of the cell conductive lines 340 based on the upper surfaces of the element isolation layers 305.

A contact separation pattern 341 may be interposed between each bit line contact 346 and a node pad 325 adjacent to the bit line contact 346. The contact separation pattern 341 may include an insulating material.

Each node separation pattern 345 may be interposed between adjacent node pads 325. The node separation patterns 345 are disposed on the substrate 100. Each of the node separation patterns 345 may separate the node pads 325 that are adjacent to each other in the first direction DR1. Each of the node separation patterns 345 may cover the upper surfaces of the node pads 325 that are adjacent to each other in the first direction DR1. In cross section, each of the node separation patterns 345 may have a "T" shape.

Upper surfaces of the node separation patterns 345 may be in the same plane as the upper surfaces of the bit line contacts 346. The upper surfaces of the node separation patterns 345 may be located at the same height as the upper surfaces of the bit line contacts 346 from the upper surfaces of the element isolation layers 305. The upper surfaces of the node separation patterns 345 may be located at the same height as the lower surfaces of the cell conductive lines 340 with respect to the upper surfaces of the element isolation layers 305.

The node separation patterns 345 may include, for example, an insulating material. Lower surfaces of the node separation patterns 345 may be located at the same height as the upper surfaces of the element isolation layers 305. However, embodiments of the present inventive concept are not limited thereto. For example, lower surfaces of the node separation patterns 345 may also be lower than the upper surfaces of the element isolation layer 305.

A stacked structure of a cell conductive line 340 in an area overlapping the upper surface of each bit line contact 346 may be the same as a stacked structure of a cell conductive line 340 in an area not overlapping the upper surface of each bit line contact 346.

The second storage contacts 320 are connected to the node pads 325. The second storage contacts 320 connect the node pads 325 to the landing pads 360.

The landing pads 360 connected to a capacitor CAP and lower electrodes 130, a capacitor dielectric layer 160 and an upper electrode 170 included in the capacitor CAP may be substantially the same as those described above with reference to FIGS. 1 through 6. For example, an upper surface of a second landing pad 362 may be disposed above an upper surface of a first landing pad 361. For another example, a lower surface of a first lower electrode 131 may be disposed below a lower surface of a second lower electrode 132.

Figure 11:
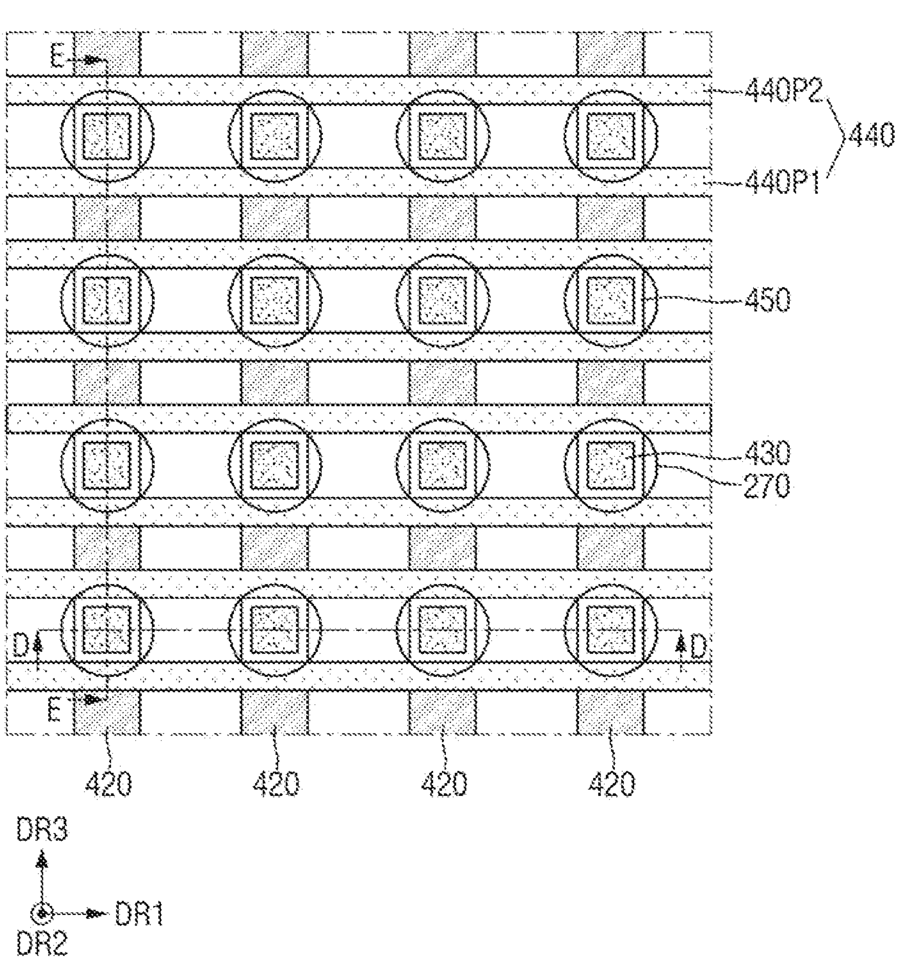
FIG. 11 is a layout view of a semiconductor device according to an embodiment of the present inventive concept.
Figure 12:
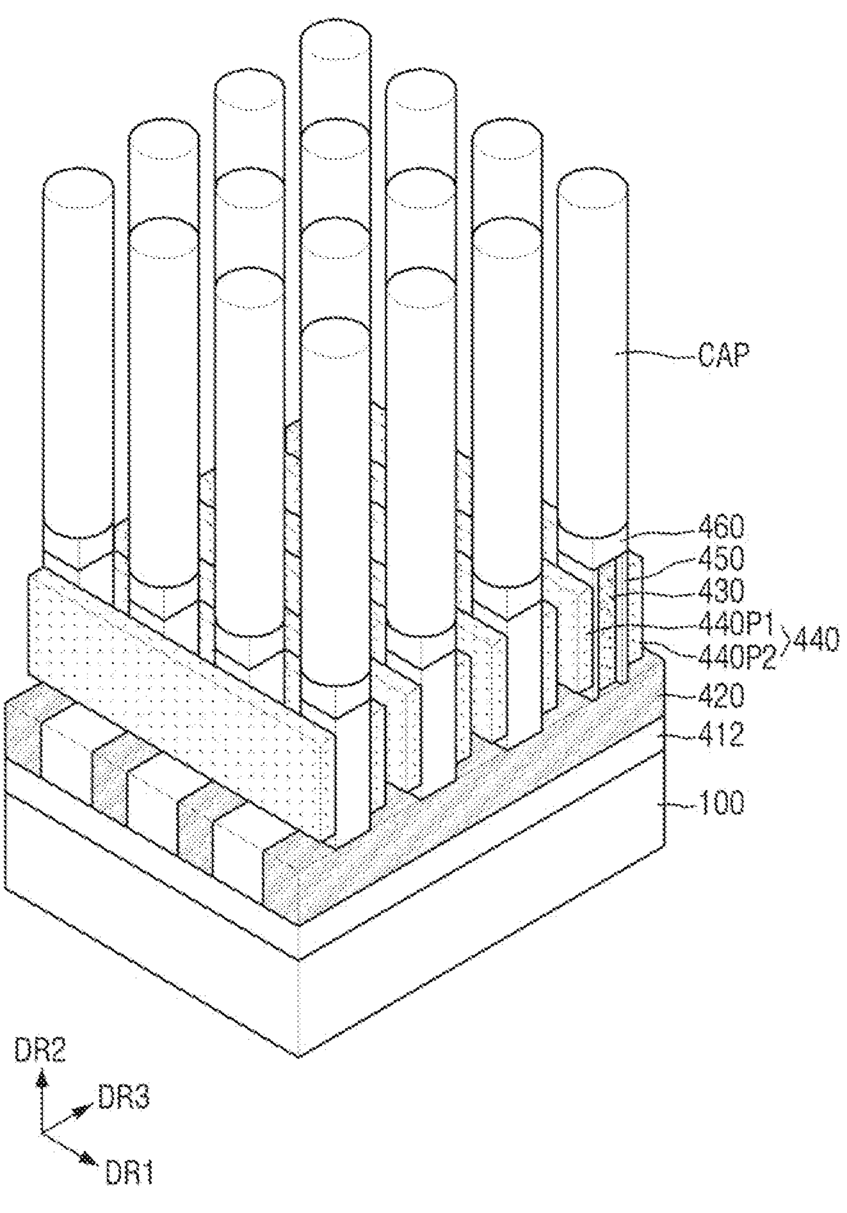
FIG. 12 is a perspective view of the semiconductor device according to an embodiment of the present inventive concept.
Figure 13:
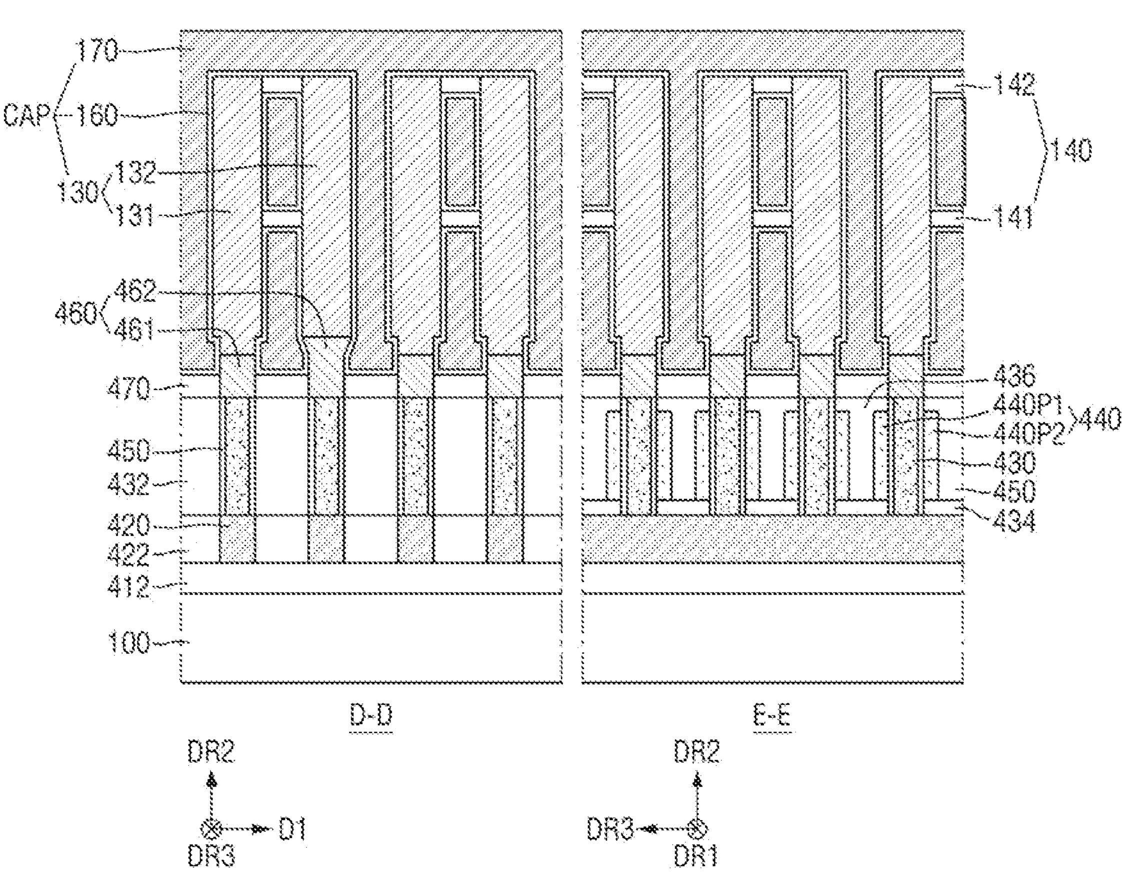
FIG. 13 is a cross-sectional view taken along lines D-D and E-E of FIG. 11.

FIG. 11 is a layout view of a semiconductor device according to an embodiment of the present inventive concept. FIG. 12 is a perspective view of the semiconductor device according to an embodiment of the present inventive concept. FIG. 13 is a cross-sectional view taken along lines D-D and E-E of FIG. 11. For ease of description, the following description will focus on differences from the semiconductor devices described above with reference to FIGS. 1 through 10. Accordingly, repetitive descriptions may be omitted or briefly discussed.

Referring to FIGS. 11 through 13, the semiconductor device may include a substrate 100, a plurality of first conductive lines 420, channel layers 430, gate electrodes 440, gate insulating layers 450, and a capacitor CAP. The semiconductor device of FIGS. 11 through 13 may be a memory device including a vertical channel transistor (VCT). The vertical channel transistor may refer to a structure in which a channel length of a channel layer 430 extends from the substrate 100 in a vertical direction.

A lower insulating layer 412 may be disposed on the substrate 100, and the first conductive lines 420 may be disposed on the lower insulating layer 412. The first conductive lines 420 may be spaced apart from each other in a first direction DR1 and may extend in a third direction DR3. A plurality of first insulating patterns 422 may be disposed on the lower insulating layer 412 to fill spaces between the first conductive lines 420. The first insulating patterns 422 may extend in the third direction DR3, and upper surfaces of the first insulating patterns 422 may be disposed at the same level as upper surfaces of the first conductive lines 420. The first conductive lines 420 may function as bit lines of the semiconductor device.

In some embodiments of the present inventive concept, the first conductive lines 420 may include doped polysilicon, a metal, a conductive metal nitride, a conductive metal silicide, a conductive metal oxide, or a combination thereof. For example, the first conductive lines 420 may be made of, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. The first conductive lines 420 may include a single layer or multilayer of the above materials. In some embodiments of the present inventive concept, the first conductive lines 420 may include a 2D semiconductor material, and the 2D semiconductor material may include, for example, graphene, carbon nanotubes, or a combination thereof.

The channel layers 430 may be disposed on the first conductive lines 420 and may be arranged in a matrix form and spaced apart from each other in the first direction DR1 and the third direction DR3. The channel layers 430 may have a first width along the first direction DR1 and a first height along a second direction DR2, and the first height may be greater than the first width. For example, the first height may be, but is not limited to, about 2 to about 10 times the first width. A bottom portion of each channel layer 430 may function as a first source/drain region, and an upper portion of each channel layer 430 may function as a second source/drain region. A portion of each channel layer 430 between the first and second source/drain regions may function as a channel region.

In some embodiments of the present inventive concept, the channel layers 430 may include an oxide semiconductor. For example, the oxide semiconductor may include $In_xGa_7Zn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_zO$, or a combination thereof. The channel layers 430 may include a single layer or multilayer of the oxide semiconductor. In some embodiments of the present inventive concept, the channel layers 430 may have a bandgap energy greater than that of silicon. For example, the channel layers 430 may have a bandgap energy of about 1.5 to about 5.6 eV. For example, the channel layers 430 may have a bandgap energy of about 2.0 to about 4.0 eV. For example, the channel layers 430 may be polycrystalline or amorphous, but embodiments of the present inventive concept are not limited thereto. In some embodiments of the present inventive concept, the channel layers 430 may include a 2D semiconductor material. For example, the 2D semiconductor material may include graphene, carbon nanotubes, or a combination thereof.

The gate electrodes 440 may be disposed on both sidewalls of each channel layer 430 to extend in the first direction DR1. Each of the gate electrodes 440 may include a first sub-gate electrode 440P1, which faces a first sidewall of a channel layer 430, and a second sub-gate electrode 440P2, which faces a second sidewall opposite the first sidewall of the channel layer 430. Since one channel layer 430 is disposed between the first sub-gate electrode 440P1 and the second sub-gate electrode 440P2, the semiconductor device may have a dual-gate transistor structure. However, the present inventive concept is not limited thereto. The second sub-gate electrode 440P2 may also be omitted, and only the first sub-gate electrode 440P1 facing the first sidewall of each channel layer 430 may be formed to implement a single-gate transistor structure.

The gate electrodes 440 may include doped polysilicon, a metal, a conductive metal nitride, a conductive metal silicide, a conductive metal oxide, or a combination thereof. For example, the gate electrodes 440 may be made of, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

The gate insulating layers 450 may at least partially surround the sidewalls of the channel layers 430 and may be interposed between the channel layers 430 and the gate electrodes 440. For example, as illustrated in FIG. 11, the sidewalls of each channel layer 430 may all be at least partially surrounded by a gate insulating layer 450, and a portion of sidewalls of each gate electrode 440 may contact agate insulating layer 450. In some embodiments of the present inventive concept, the gate insulating layers 450 may extend in a direction (e.g., the first direction DR1) in which the gate electrodes 440 extend, and only two sidewalls facing a gate electrode 440 among the sidewalls of each channel layer 430 may contact a gate insulating layer 450.

In some embodiments of the present inventive concept, the gate insulating layers 450 may be made of a silicon oxide layer, a silicon oxynitride layer, a high-k layer having a higher dielectric constant than the silicon oxide layer, or a combination thereof. The high-k layer may be made of metal oxide or metal oxynitride. For example, the high-k layer that can be utilized as the gate insulating layers 450 may be made of, but is not limited to, $HfO_2$, HfSiO, HfSiON, HfTaO, HfTiO, HfZrO, $ZrO_2$, $Al_2O_3$, or a combination thereof.

A plurality of second insulating patterns 432 may extend along the third direction DR3 on the first insulating patterns 422, and each channel layer 430 may be disposed between two adjacent ones of the second insulating patterns 432. In addition, a first buried layer 434 and a second buried layer 436 may be disposed in each space between two adjacent channel layers 430, each being located between two adjacent second insulating patterns 430. The first buried layer 434 may be disposed in a bottom portion of each space between two adjacent channel layers 430, and the second buried layer 436 may be disposed on the first buried layer 434 and may be formed to fill the remaining portion of the space between the two adjacent channel layers 430. An upper surface of the second buried layer 436 may be disposed at the same level as upper surfaces of the channel layers 430, and the second buried layer 436 may cover an upper surface of each gate electrode 440. In addition, the second insulating patterns 432 may be formed as a material layer continuous to the first insulating patterns 422, or the second buried layer 436 may be formed as a material layer continuous to the first buried layer 434.

Capacitor contacts 460 may be disposed on the channel layers 430. The capacitor contacts 460 may vertically overlap the channel layers 430 and may be arranged in a matrix form and spaced apart from each other in the first direction DR1 and the third direction DR3. For example, the capacitor contacts 460 may be made of, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

An upper insulating layer 470 may be disposed on the second insulating patterns 432 and the second buried layers 436 to at least partially surround sidewalls of the capacitor contacts 460. The upper insulating layer 470 may correspond to the first interlayer insulating layer 110 of FIG. 2. In addition, the capacitor contacts 460 may correspond to the landing pads 120 of FIG. 2. For example, the capacitor contacts 460 may protrude above the upper insulating layer 470. For another example, the capacitor contacts 460 may include a first contact 461 and a second contact 462. Upper surfaces of the first contact 461 and the second contact 462 may be at different heights from each other. The upper surface of the first contact 461 may be disposed below the upper surface of the second contact 462 based on a lower surface of the substrate 100.

The capacitor CAP may be disposed on the upper insulating layer 470. The capacitor CAP may include lower electrodes 130, a capacitor dielectric layer 160, and an upper electrode 170.

The lower electrodes 130 may be eclectically connected to upper surfaces of the capacitor contacts 460. The lower electrodes 130 may be formed as a pillar type extending in the second direction DR2, but embodiments of the present inventive concept are not limited thereto. In some embodiments of the present inventive concept, the lower electrodes 130 may vertically overlap the capacitor contacts 460 and may be arranged in a matrix form and spaced apart from each other in the first direction DR1 and the third direction DR3. In addition, landing pads may be disposed between the capacitor contacts 460 and the lower electrodes 130 so that the lower electrodes 130 are arranged in a hexagonal shape.

The capacitor CAP of FIGS. 11 through 13 may be the same as the capacitor CAP described above with reference to FIGS. 1 through 6.

For example, the lower electrodes 130 may include a first lower electrode 131 and a second lower electrode 132. Lower surfaces of the first lower electrode 131 and the second lower electrode 132 may be at different heights from each other. For example, the lower surface of the first lower electrode 131 may be disposed below the lower surface of the second lower electrode 132 based on the lower surface of the substrate 100.

The capacitor dielectric layer 160 may extend along an upper surface of the upper insulating layer 470. For example, the capacitor dielectric layer 160 may directly contact the upper surface of the upper insulating layer 470. The capacitor dielectric layer 160 may extend along side surfaces of the capacitor contacts 460 that protrude above the upper insulating layer 470.

Figure 14:
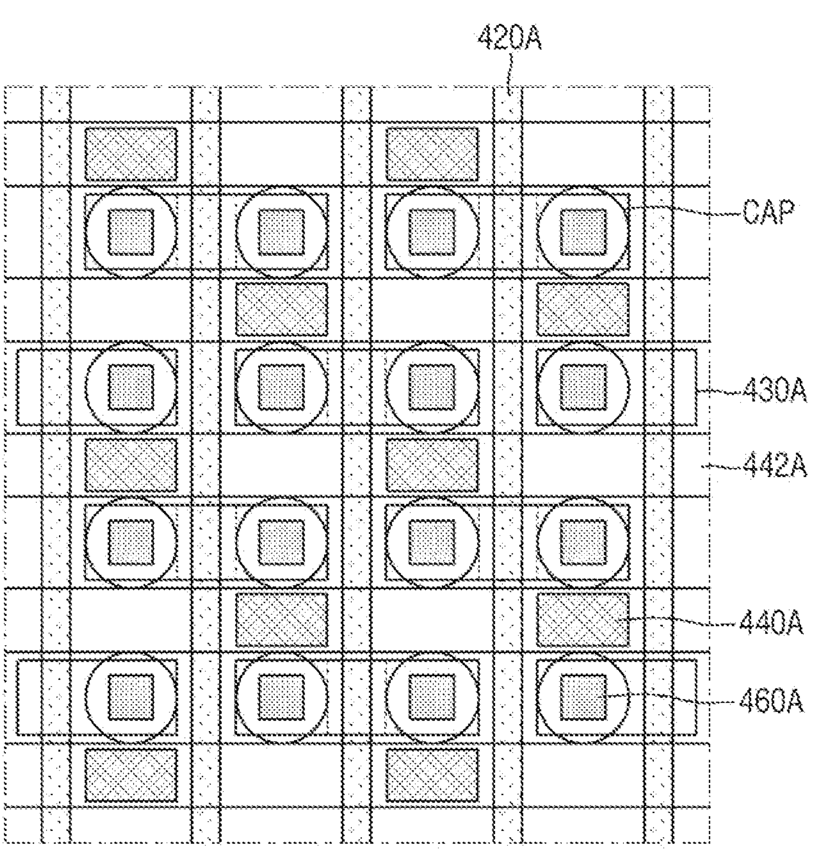
FIG. 14 is a layout view of a semiconductor device according to an embodiment of the present inventive concept.
Figure 14:
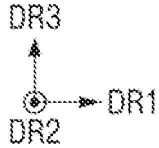
Figure 15:
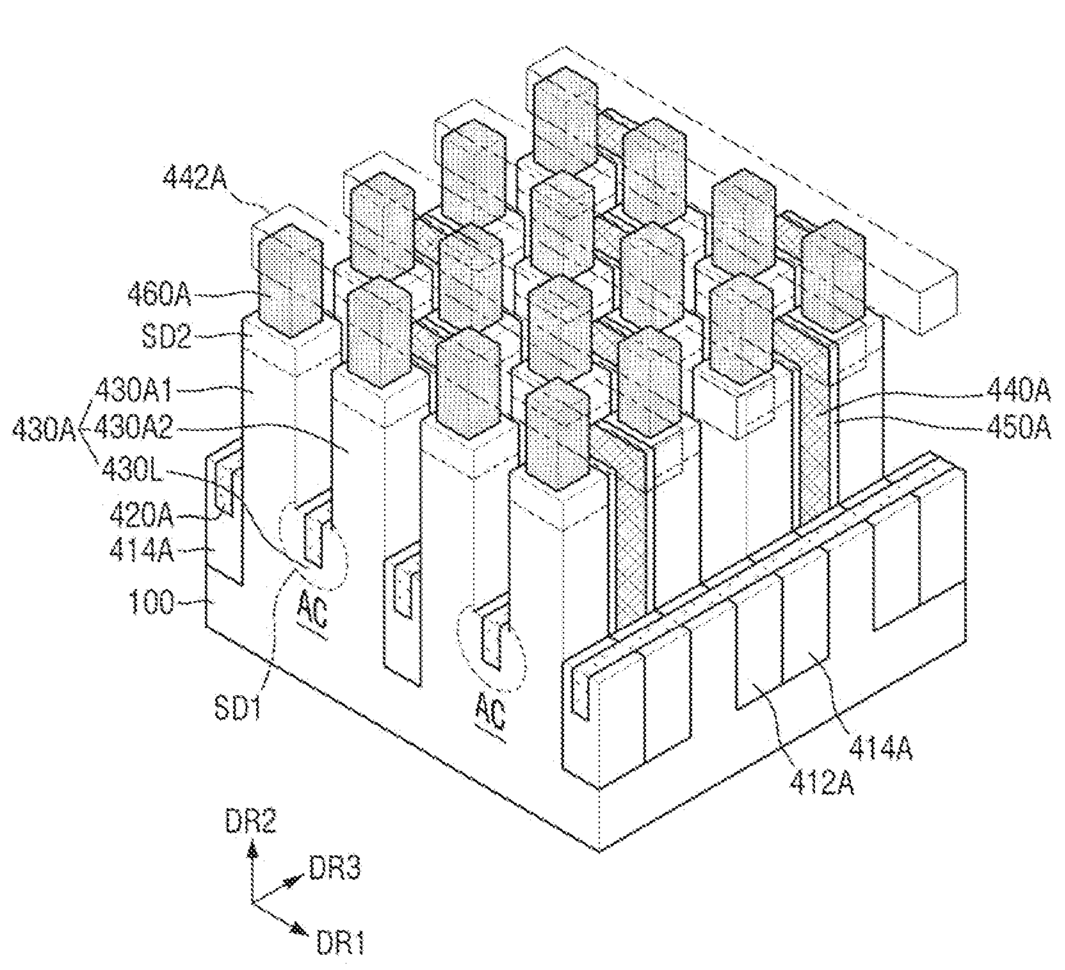
FIG. 15 is a perspective view of the semiconductor device according to an embodiment of the present inventive concept.

FIG. 14 is a layout view of a semiconductor device according to an embodiment of the present inventive concept. FIG. 15 is a perspective view of the semiconductor device according to an embodiment of the present inventive concept. For ease of description, the following description will focus on differences from the semiconductor devices described above with reference to FIGS. 1 through 13. Accordingly, repetitive descriptions may be omitted or briefly discussed.

Referring to FIGS. 14 and 15, the semiconductor device may include a substrate 100, a plurality of first conductive lines 420A, channel structures 430A, contact gate electrodes 440A, a plurality of second conductive lines 442A, and a capacitor CAP. The semiconductor device may be a memory device including a vertical channel transistor.

A plurality of active areas AC may be defined in the substrate 100 by first and second element isolation layers 412A and 414A. The channel structures 430A may be disposed in the active areas AC, respectively. Each of the channel structures 430A may include first and second active pillars 430A1 and 430A2 extending in a vertical direction and a connection portion 430L connected to a bottom portion of the first active pillar 430A1 and a bottom portion of the second active pillar 430A2. A first source/drain region SD1 may be disposed in the connection portion 430L, and a second source/drain region SD2 may be disposed on each of the first and second active pillars 430A1 and 430A2. Each of the first active pillar 430A1 and the second active pillar 430A2 may form an independent unit memory cells.

The first conductive lines 420A may extend in a direction crossing the active areas AC, for example, in a third direction DR3. One of the first conductive lines 420A may be disposed on the connection portion 430L between the first active pillar 430A1 and the second active pillar 430A2 and may be disposed on the first source/drain region SD1. Another first conductive line 420A adjacent to the above first conductive line 420A may be disposed between two channel structures 430A. One of the first conductive lines 420A may function as a common bit line included in two unit memory cells formed by the first active pillar 430A1 and the second active pillar 430A2 disposed on both sides of the first conductive line 420A.

One contact gate electrode 440A may be disposed between two channel structures 430A adjacent to each other in the third direction DR3. For example, a contact gate electrode 440A may be disposed between the first active pillar 430A1, which is included in one channel structure 430A, and the second active pillar 430A2 of another channel structure 430A adjacent to the channel structure 430A. One contact gate electrode 440A may be shared by the first active pillar 430A1 and the second active pillar 430A2 disposed on both sidewalls thereof. A gate insulating layer 450A may be disposed between the contact gate electrode 440A and the first active pillar 430A1 and between the contact gate electrode 440A and the second active pillar 430A2. The second conductive lines 442A may extend in a first direction DR1 on upper surfaces of the contact gate electrodes 440A. The second conductive lines 442A may function as word lines of the semiconductor device.

Capacitor contacts 460A may be disposed on the channel structures 430A. The capacitor contacts 460A may be disposed on the second source/drain regions SD2, and the capacitor CAP may be disposed on the capacitor contacts 460A. The capacitor contacts 460A may correspond to the landing pads 120 of FIG. 2. The capacitor CAP may correspond to the capacitor CAP of FIG. 8.

FIGS. 16 through 29 are views illustrating intermediate steps of a method of manufacturing a semiconductor device according to an embodiment of the present inventive concept. For reference, FIGS. 16 through 29 are views illustrating intermediate steps of a method of manufacturing the semiconductor device illustrated in FIG. 2, according to an embodiment of the present inventive concept. For ease of description, the following description will focus on differences from the description given with reference to FIGS. 1 through 3. Accordingly, repetitive descriptions may be omitted or briefly discussed.

Figure 16:
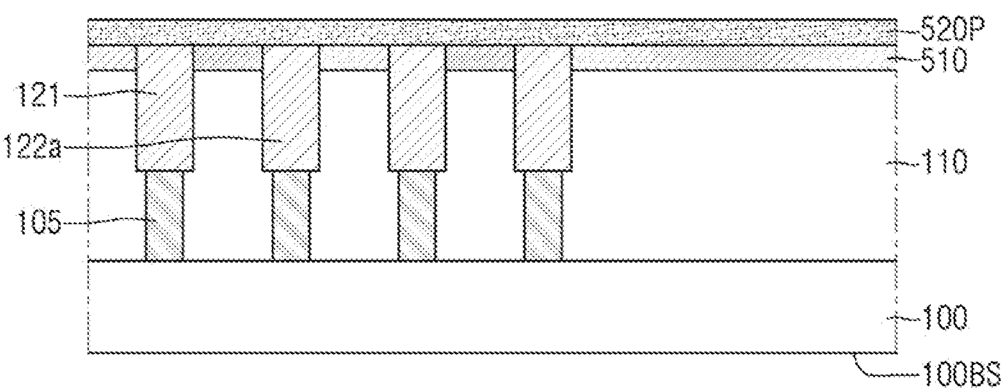

Referring to FIG. 16, first landing pads 121 and an extension portion 122*a* are formed in a first interlayer insulating layer 110. Then, a first oxide layer 510 and a pre-etch stop layer 520P are formed on the first interlayer insulating layer 110.

The first landing pads 121 and the extension portion 122*a* may each be formed to protrude above an upper surface of the first interlayer insulating layer 110 based on a lower surface 100BS of a substrate 100. For example, upper surfaces of the first landing pads 121 and the extension portion 122*a* may be disposed above the upper surface of the first interlayer insulating layer 110.

A portion of each of the first landing pads 121 and the extension portion 122*a* may be formed in the first oxide layer 510. The first oxide layer 510 may partially surround side surfaces of the first landing pads 121 and the extension portion 122*a*.

The pre-etch stop layer 520P may be formed on the first landing pads 121, the extension portion 122*a*, and the first oxide layer 510. The pre-etch stop layer 520P may cover the upper surfaces of the first landing pads 121 and the extension portion 122*a*. The pre-etch stop layer 520P may include SIB.

Figure 17:
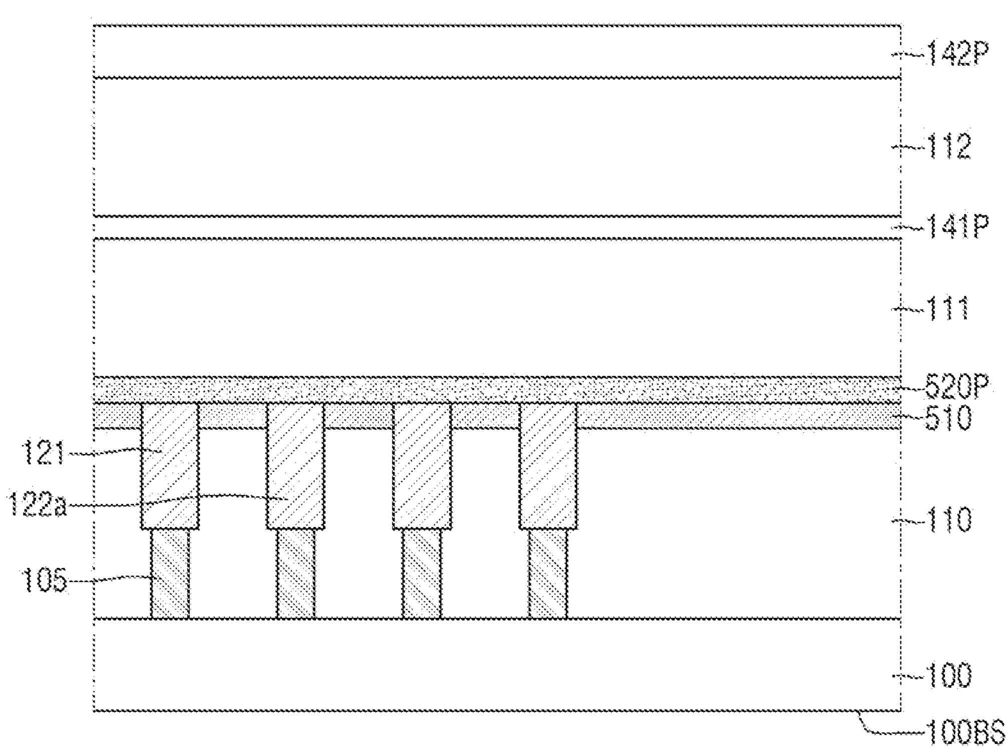

Referring to FIG. 17, a lower mold layer 111, a first pre-support 141P, an upper mold layer 112, and a second pre-support 142P are sequentially formed on the pre-etch stop layer 520P.

For example, the lower mold layer 111 and the upper mold layer 112 may include silicon oxide. For example, the first pre-support 141P and the second pre-support 142P may include silicon nitride.

Figure 18:
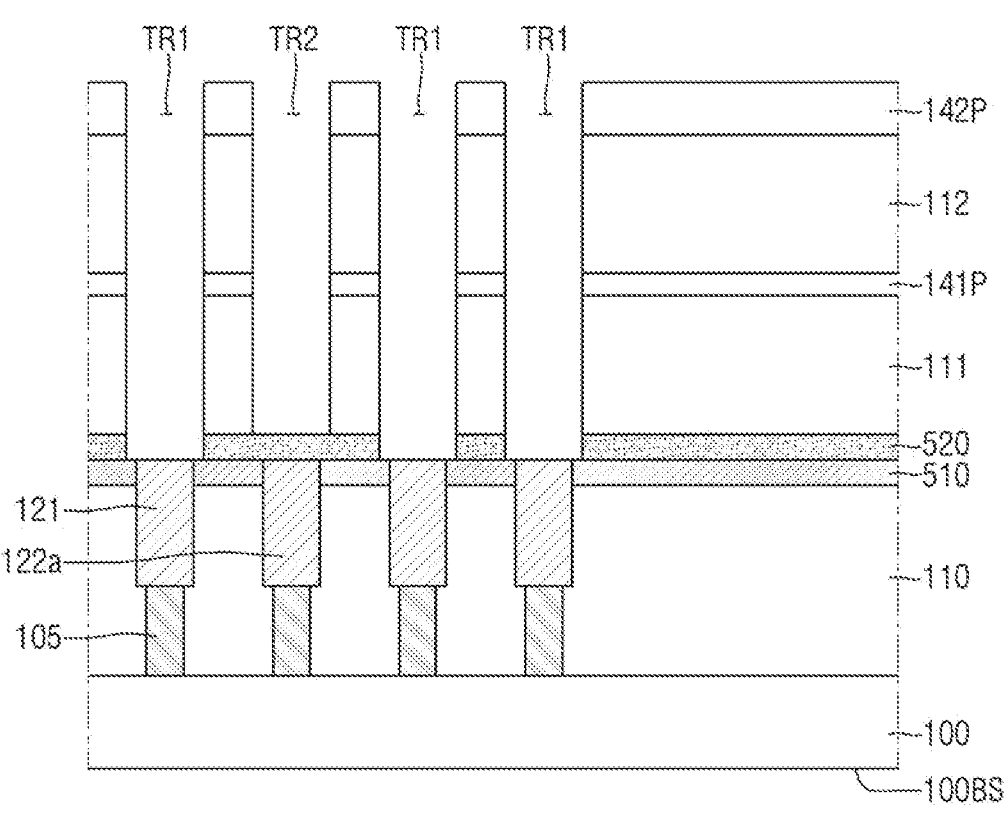

Referring to FIG. 18, first trenches TR1 and a second trench TR2 may be formed. An etch stop layer 520 may be formed by etching a portion of the pre-etch stop layer 520P.

The first trenches TR1 may penetrate the lower mold layer 111, the first pre-support 141P, the upper mold layer 112, the second pre-support 142P, and the etch stop layer 520. The first trenches TR1 may expose the first landing pads 121.

The second trench TR2 may penetrate the lower mold layer 111, the first pre-support 141P, the upper mold layer 112, and the second pre-support 142P. The second trench TR2 might not penetrate the etch stop layer 520. Accordingly, the second trench TR2 may expose the etch stop layer 520 but might not expose the extension portion 122*a*.

Figure 19:
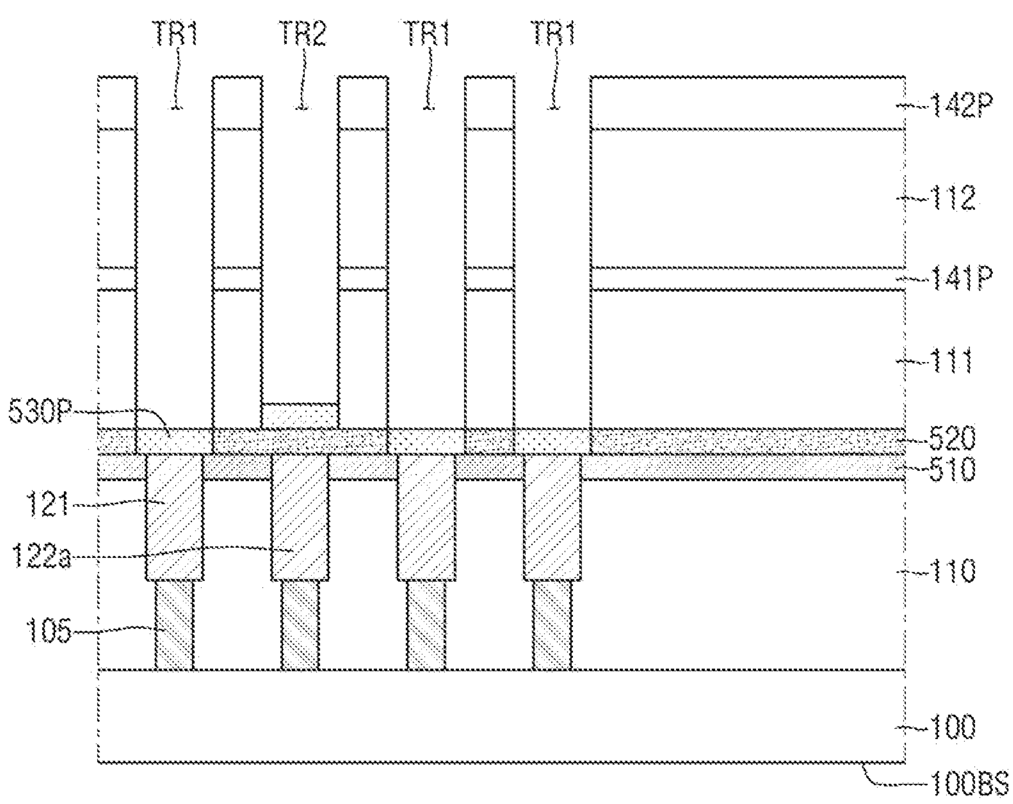

Referring to FIG. 19, a second pre-oxide layer 530P may be formed in the first trenches TR1 and the second trench TR2.

The second pre-oxide layer 530P in the first trenches TR1 may be formed on the first landing pads 121. The second pre-oxide layer 530P may cover the first landing pads 121.

The second pre-oxide layer 530P in the second trench TR2 may be formed on the etch stop layer 520. The second pre-oxide layer 530P may cover the etch stop layer 520.

Figure 20:
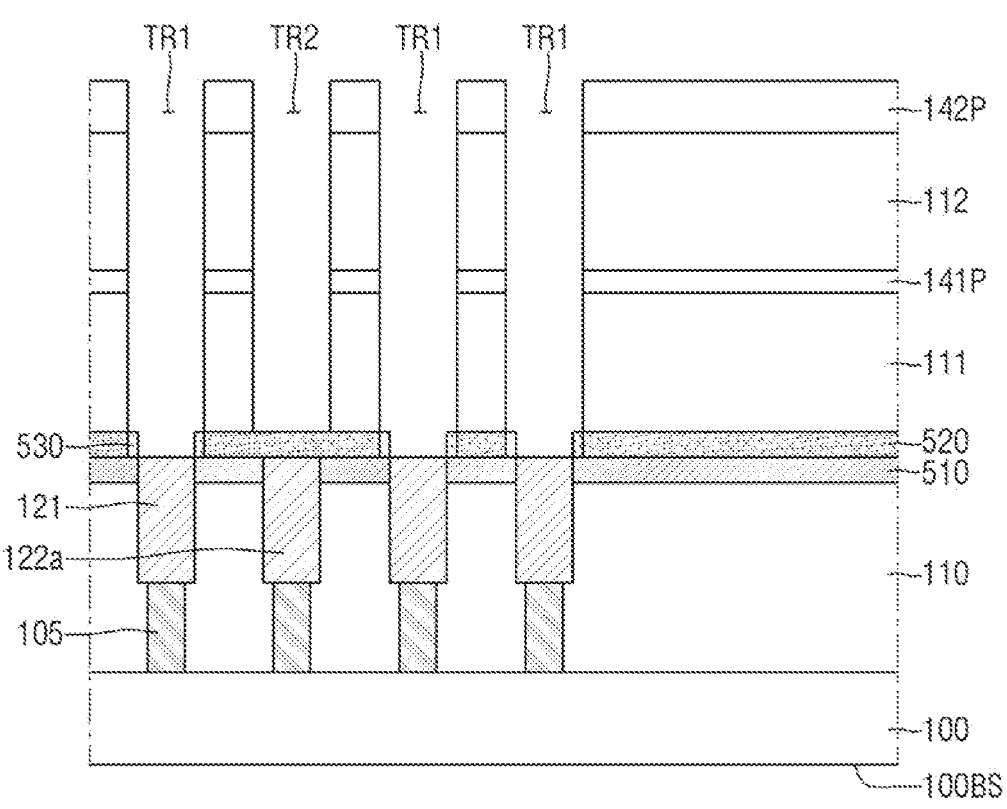

Referring to FIG. 20, a second oxide layer 530 may be formed by etching a portion of the second pre-oxide layer 530P.

Referring to FIGS. 19 and 20, the second pre-oxide layer 530P in each of the first trenches TR1 may be partially removed. The second oxide layer 530 in the first trenches TR1 may expose the first landing pads 120. In the first trenches TR1, the second oxide layer 530 may cover the etch stop layer 520 disposed on sidewalls of the first trenches TR1.

The second pre-oxide layer 530P in the second trench TR2 may be entirely removed. The etch stop layer 520 may be exposed in the second trench TR2.

Figure 21:
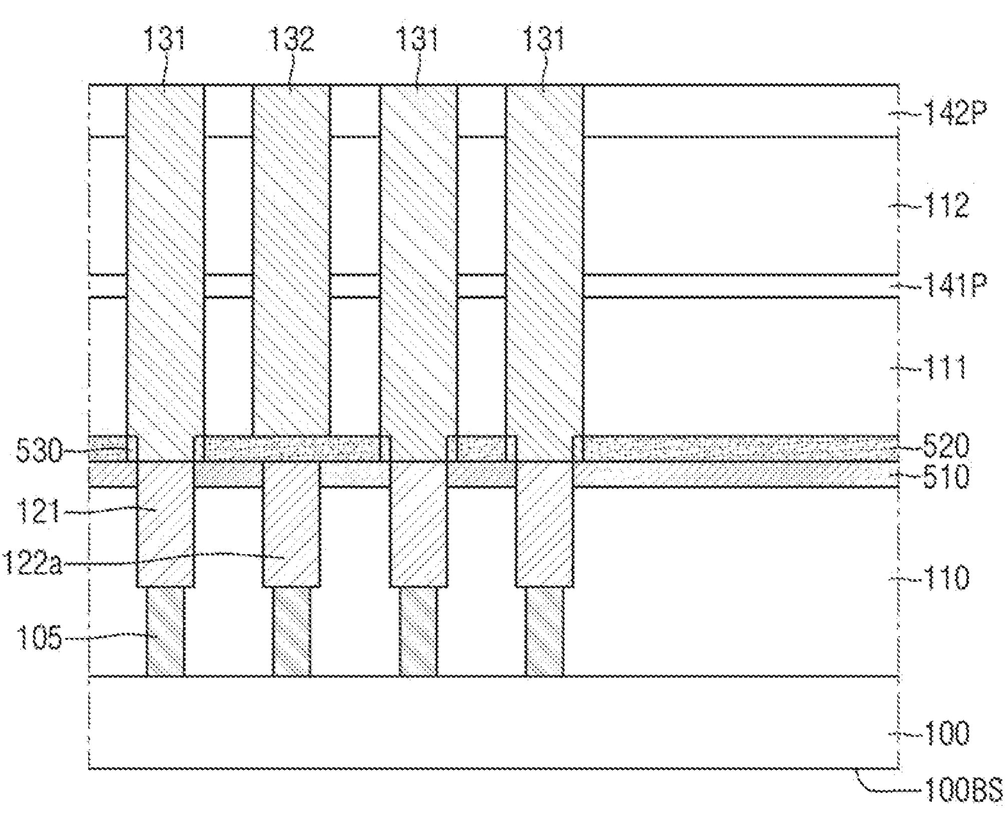

Referring to FIG. 21, first lower electrodes 131 and a second lower electrode 132 may be formed.

For example, the first lower electrodes 131 and the second lower electrode 132 may include titanium nitride (TiN).

The first lower electrodes 131 may be formed in the first trenches TR1. The first lower electrodes 131 may fill the first trenches TR1. The first lower electrodes 131 may be formed on the first landing pads 121. The first lower electrodes 131 may be connected to the first landing pads 121. For example, the first lower electrodes 131 may directly contact the first landing pads 121.

The second lower electrode 132 may be formed in the second trench TR2. The second lower electrode 132 may fill the second trench TR2. The second lower electrode 132 may be formed on the etch stop layer 520. The second lower electrode 132 might not be connected to the extension portion 122*a*. The etch stop layer 520 may be disposed between the second lower electrode 132 and the extension portion 122*a*. The second lower electrode 132 might not contact the extension portion 122*a*.

Lower surfaces of the first lower electrode 131 and the second lower electrode 132 may be formed at different heights from each other. For example, the lower surfaces of the first lower electrodes 131 may be formed below the lower surface of the second lower electrode 132 based on the lower surface 100BS of the substrate 100. This may be because the first lower electrodes 131 are formed in the first trenches TR1 from which the etch stop layer 520 has been removed and because the second lower electrode 132 is formed in the second trench TR2 from which the etch stop layer 520 has not been removed.

Figure 22:
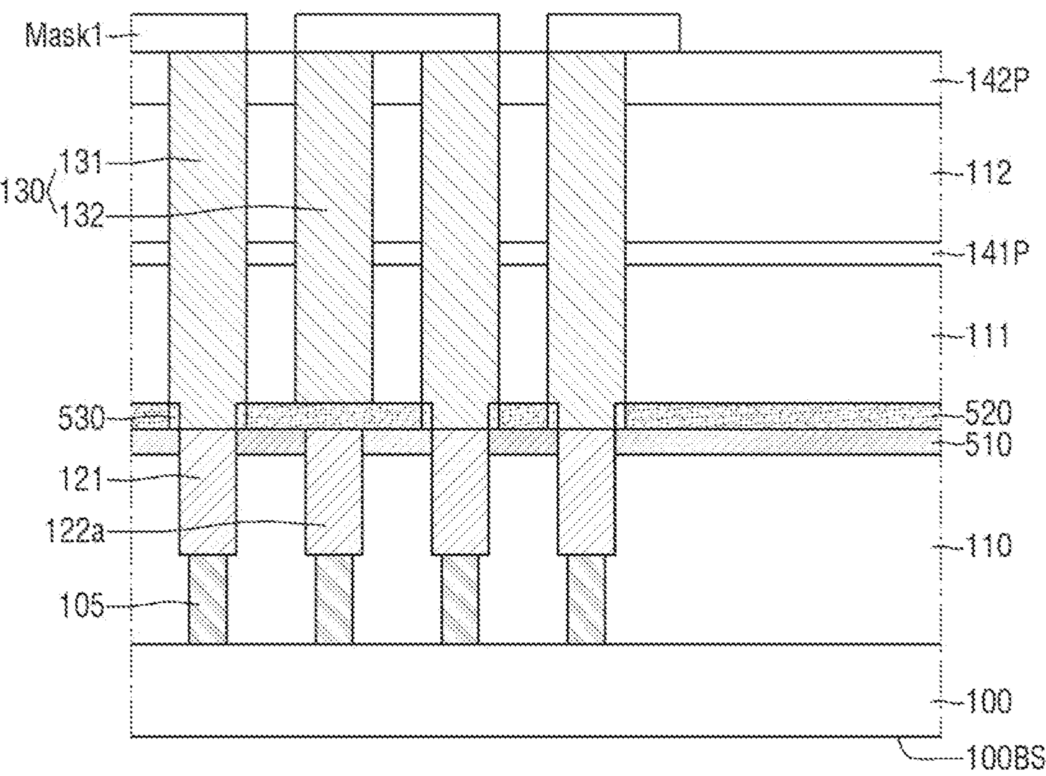
Figure 23:
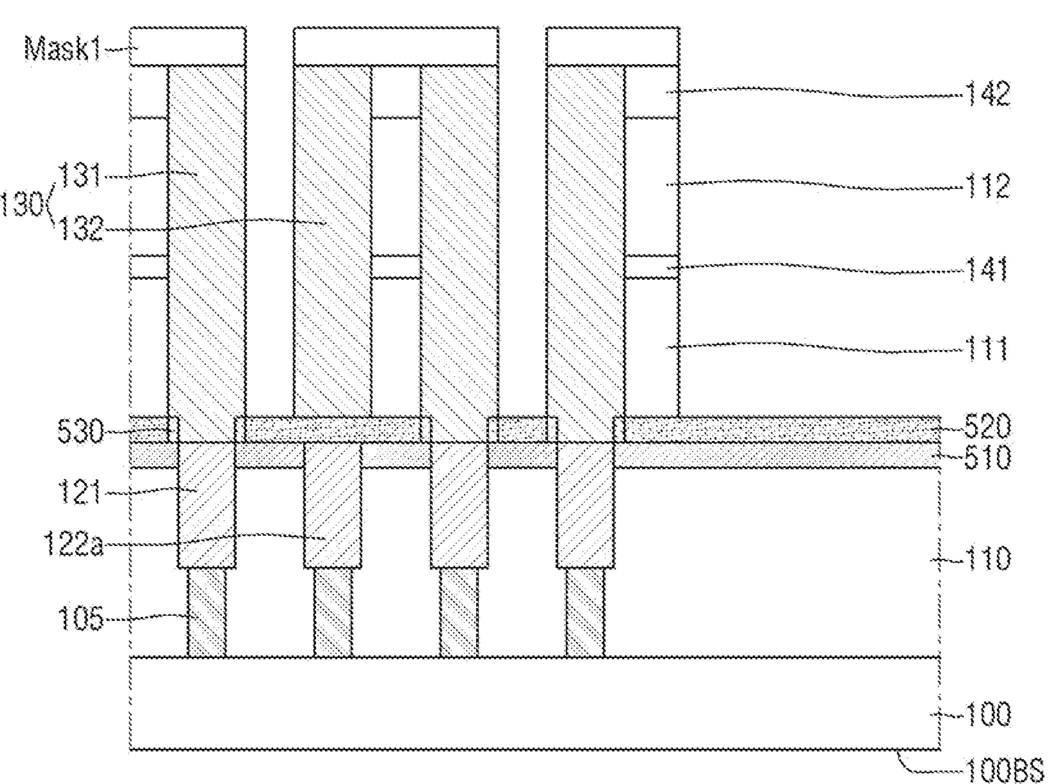

Referring to FIGS. 22 and 23, a first mask Mask1 may be formed. Then, a first support 141 and a second support 142 may be formed using the first mask Mask1.

The first mask Mask1 may be formed on lower electrodes 130 and a second pre-support 142P. The first mask Mask1 may cover upper surfaces of the lower electrodes 130.

The lower mold layer 111, a first pre-support 141P, the upper mold layer 112, and the second pre-support 142P may be patterned using the first mask Mask1. Each of the first and second support 141 and 142 may contact a portion of a sidewall of each lower electrode 130. The first and second support 141 and 142 may connect adjacent lower electrodes 130.

Figure 24:
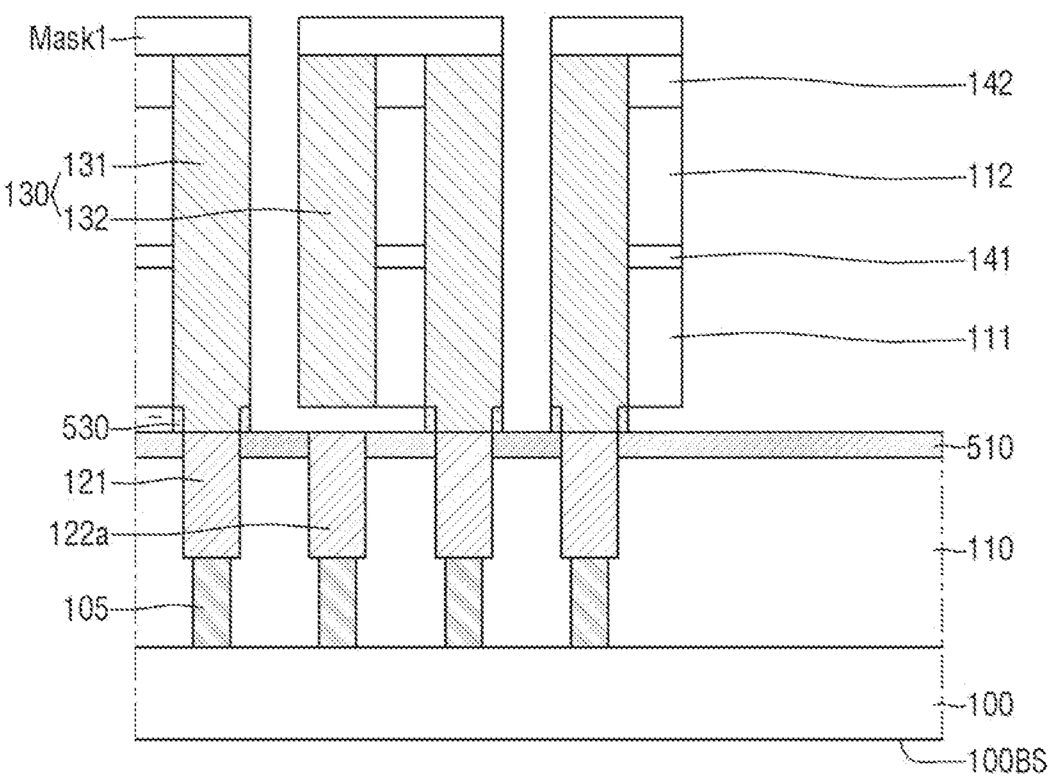

Referring to FIG. 24, the etch stop layer 520 may be removed.

The etch stop layer 520 may be removed using, for example, a radical dry cleaning process. In some embodiments of the present inventive concept, the etch stop layer 520 including SiB may be selectively removed with respect to the first oxide layer 510, the second oxide layer 530, the lower mold layer 111 and the upper mold layer 112, which include silicon oxide, and the first support 141 and the second support 142 which include silicon nitride.

The removal of the etch stop layer 520 may expose the first oxide layer 510 and the second oxide layer 530. In addition, the second lower electrode 132 and the extension portion 122*a* may be exposed. The extension portion 122*a* may be at least partially surrounded by the first oxide layer 510. A side surface of the second lower electrode 132 may be covered by the lower mold layer 111.

Figure 25:
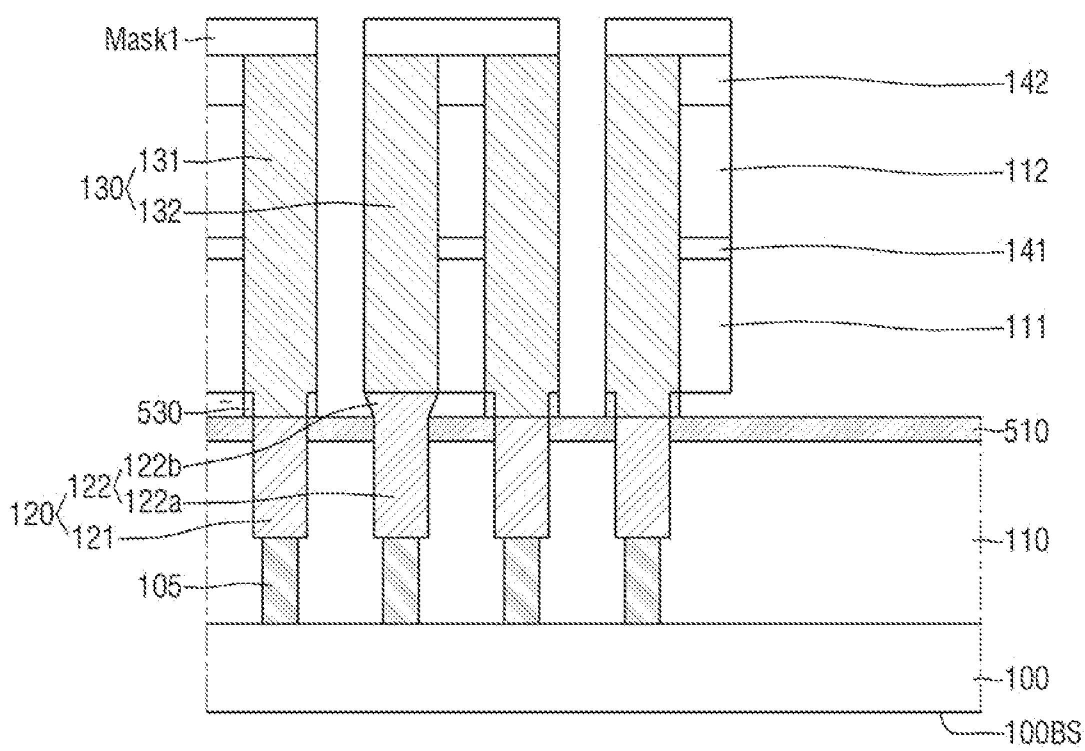

Referring to FIG. 25, a connection portion 122*b* and a second landing pad 122 may be formed.

The connection portion 122*b* may be formed between the extension portion 122*a* and the second lower electrode 132. The connection portion 122*b* may include tungsten (W).

The connection portion 122*b* may be selectively formed only between the lower surface of the second lower electrode 132 and the upper surface of the extension portion 122*a*. For example, the connection portion 122*b* might not be formed on the first oxide layer 510, the lower mold layer 111, and the second oxide layer 530.

For example, the connection portion 122*b* including tungsten (W) might not be formed on the first oxide layer 510, the lower mold layer 111 and the second oxide layer 530 including silicon oxide. The connection portion 122*b* including tungsten (W) may be formed only on the second lower electrode 132 including titanium nitride (TiN). The connection portion 122*b* including tungsten (W) may be formed only on the extension portion 122*a* including tungsten (W).

A sidewall liner 180 (see FIG. 6) may be formed on side surfaces of the first lower electrodes 131 and a side surface of the second lower electrode 132 which are not surrounded by the lower mold layer 111, the upper mold layer 112, the first support 141, and the second support 142. For example, when the connection portion 122*b* including tungsten (W) is formed, the sidewall liner 180 (see FIG. 6) including tungsten (W) may be formed on the side surfaces of the first lower electrodes 131 and the side surface of the second lower electrode 132 which are not surrounded by the lower mold layer 111, the upper mold layer 112, the first support 141, and the second support 142.

An upper surface of the second landing pad 122 including the connection portion 122*b* may be formed higher than the upper surfaces of the first landing pads 121. For example, the upper surface of the second landing pad 122 may be disposed above the upper surfaces of the first landing pads 121 based on the lower surface 100BS of the substrate 100.

Figure 26:
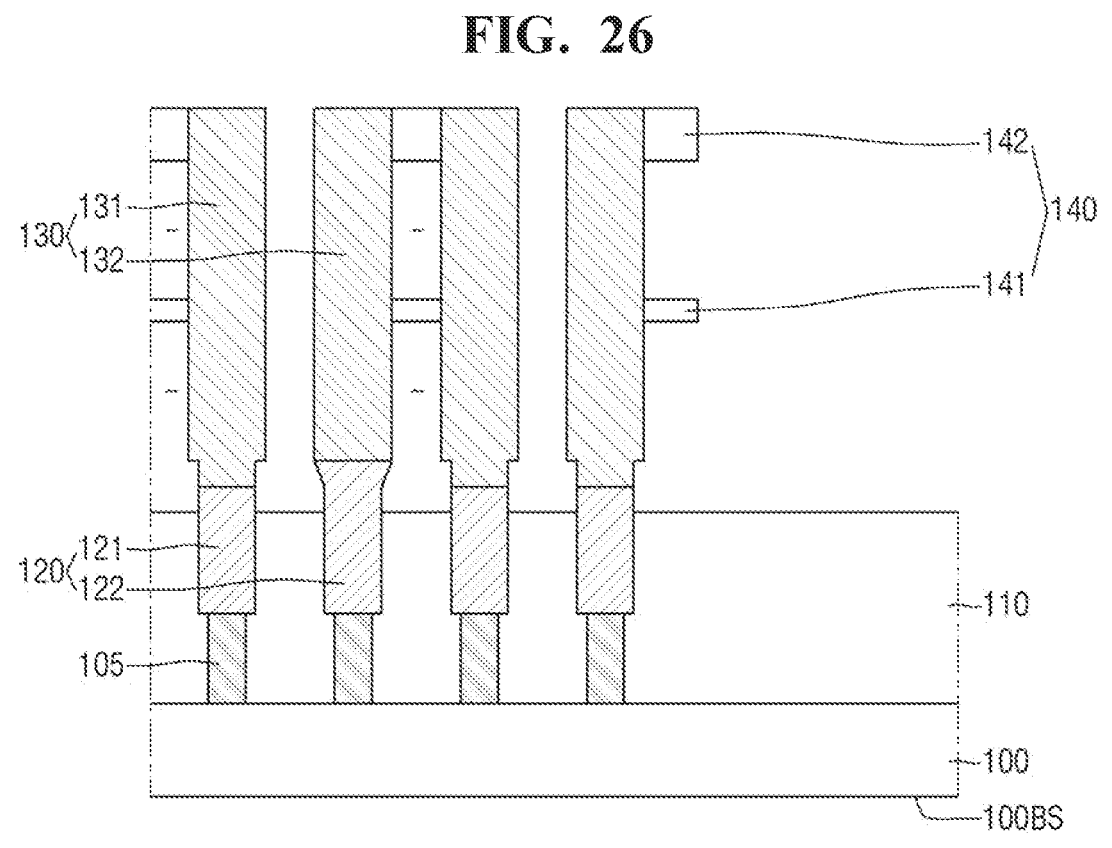

Referring to FIG. 26, the first oxide layer 510, the second oxide layer 530, the lower mold layer 111, the upper mold layer 112, and the first mask Mask1 may be removed.

The removal of the first oxide layer 510 may expose the first interlayer insulating layer 110. The first landing pads 121 and the second landing pad 122, whose side surfaces were at least partially surrounded by the first oxide layer 510, may protrude above the first interlayer insulating layer 110.

The upper mold layer 112 may be removed through areas where the second support 142 is not formed. The lower mold layer 111 may be removed through areas where the first support 141 is not formed.

Figure 27:
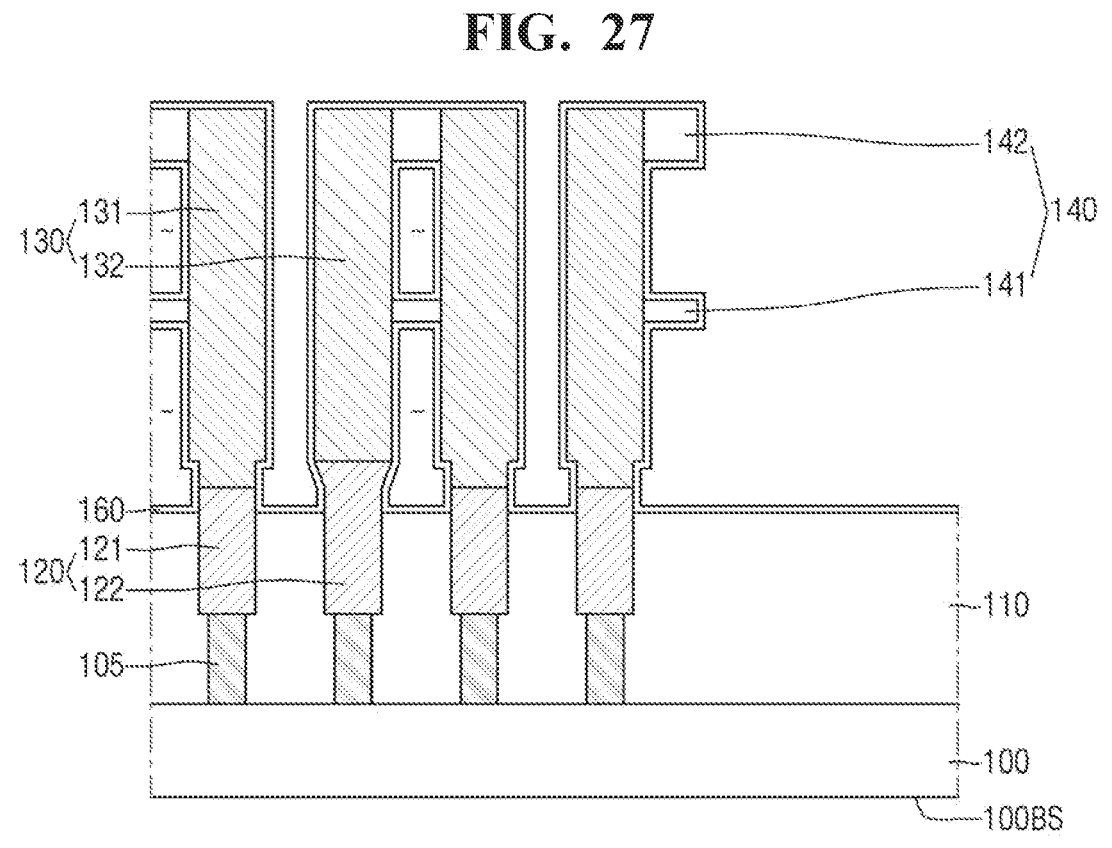

Referring to FIG. 27, a capacitor dielectric layer 160 may be formed.

The capacitor dielectric layer 160 may be formed on the first interlayer insulating layer 110, the first landing pads 121, the second landing pad 122, the lower electrodes 130, and an electrode support 140. The capacitor dielectric layer 160 may extend along the side surfaces of the first landing pads 121 and portions of the second landing pad 122 protruding above the first interlayer insulating layer 110. The capacitor dielectric layer 160 may extend along the upper surface of the first interlayer insulating layer 110 exposed by the removal of the first oxide layer 510.

Figure 28:
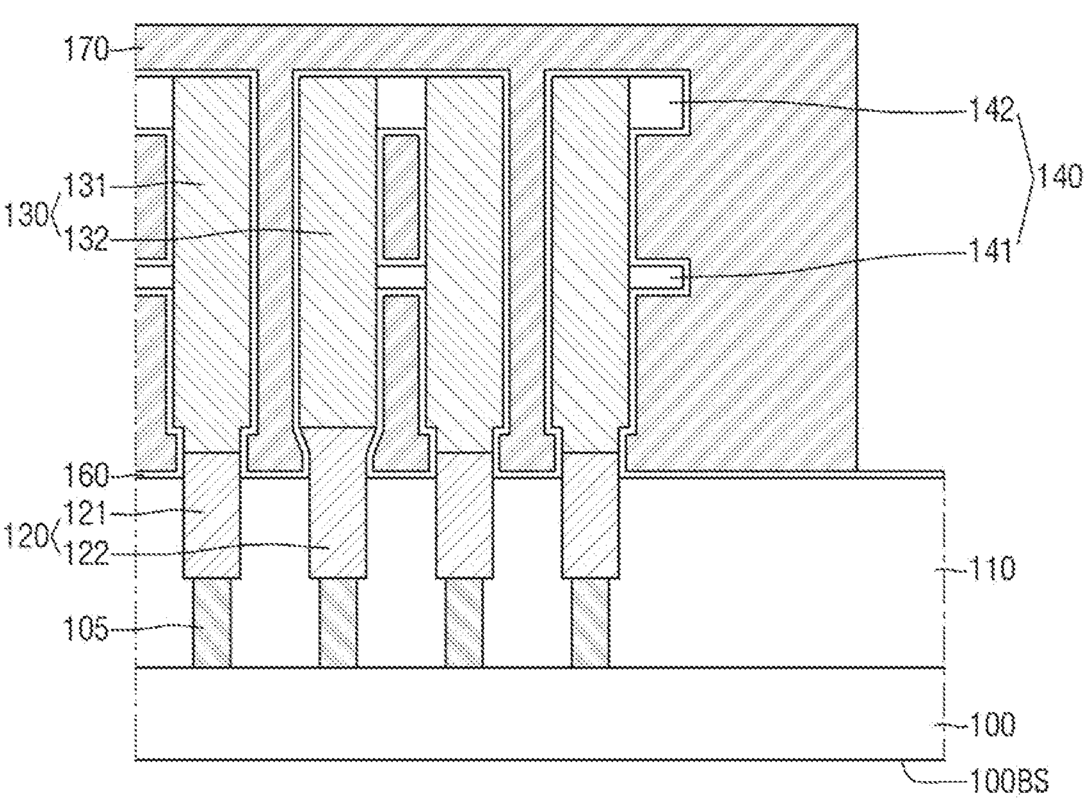

Referring to FIG. 28, an upper electrode 170 may be formed.

The upper electrode 170 may be formed on the capacitor dielectric layer 160. The upper electrode 170 may extend between the lower electrodes 130 not connected by the electrode support 140.

Figure 29:
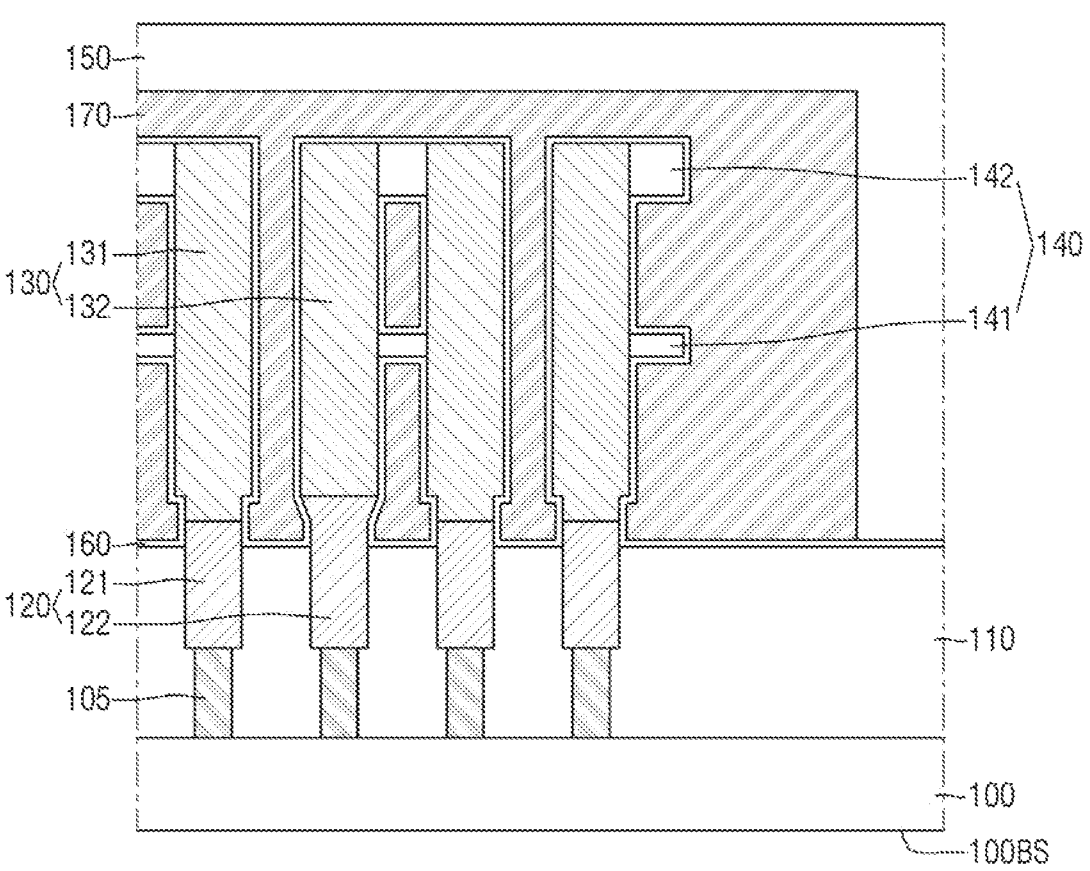

Referring to FIG. 29, a second interlayer insulating layer 150 may be formed.

The second interlayer insulating layer 150 may be formed on the upper electrode 170. The second interlayer insulating layer 150 may cover the upper electrode 170.

Figure 30:
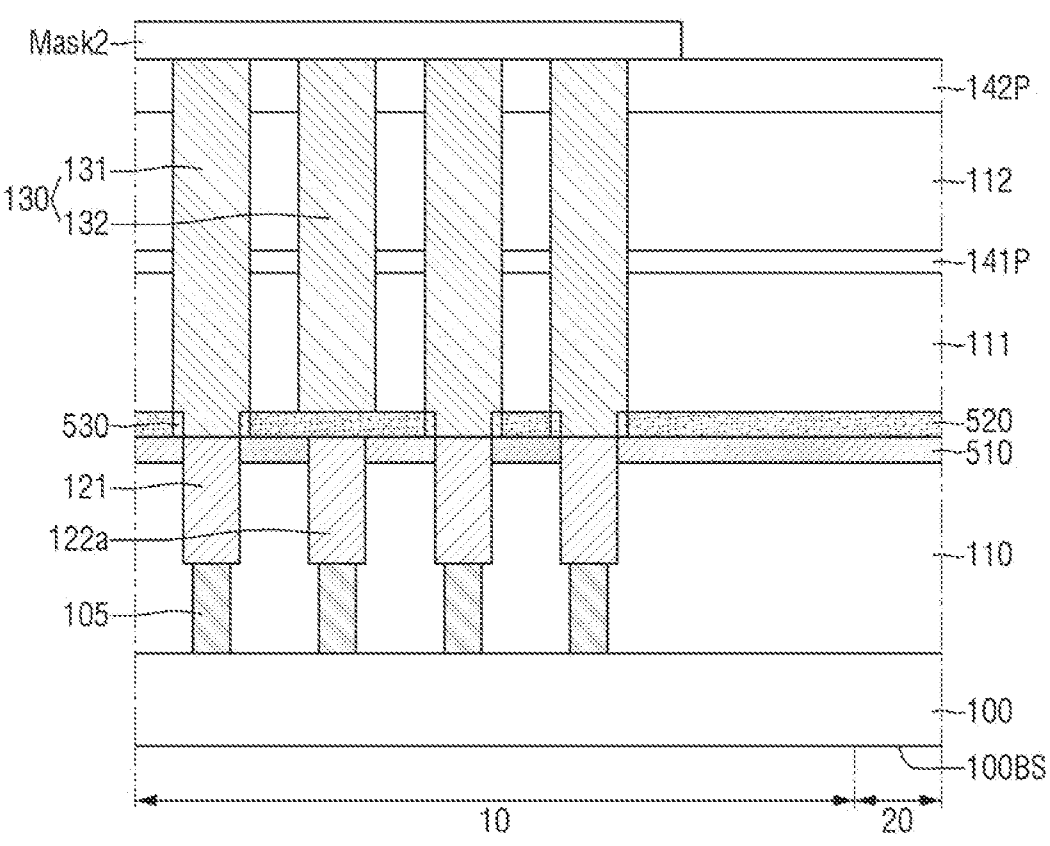
FIGS. 30, 31, 32, 33, 34, 35, 36, 37, 38, and 39 are views illustrating intermediate steps of a method of manufacturing a semiconductor device according to an embodiment of the present inventive concept.

FIGS. 30 through 39 are views illustrating intermediate steps of a method of manufacturing a semiconductor device according to an embodiment of the present inventive concept. For reference. FIGS. 30 through 39 are views illustrating intermediate steps of the method of manufacturing the semiconductor device illustrated in FIG. 2, according to an embodiment of the present inventive concept. In addition, FIG. 30 is a view illustrating a step after FIG. 21. For ease of description, the following description will focus on differences from the description given with reference to FIGS. 1 through 3 and 16 through 29.

Referring to FIGS. 21 and 30, a second mask Mask2 may be formed.

The second mask Mask2 may be formed on lower electrodes 130 and a second pre-support 142P. The second mask Mask2 may cover upper surfaces of the lower electrodes 130.

In a cell pattern area 10, the second mask Mask2 may cover all of a lower mold layer 111, a first pre-support 141P, an upper mold layer 112 and the second pre-support 142P between the lower electrodes 130. In a peripheral area 20, the second mask Mask2 may cover none of the lower mold layer 111, the first pre-support 141P, the upper mold layer 112, and the second pre-support 142P. For example, the lower mold layer 11, the first pre-support 141P, the upper mold layer 112, and the second pre-support 142P in the peripheral area 20 may be exposed by the second mask Mask2 in the peripheral area 20.

Figure 31:
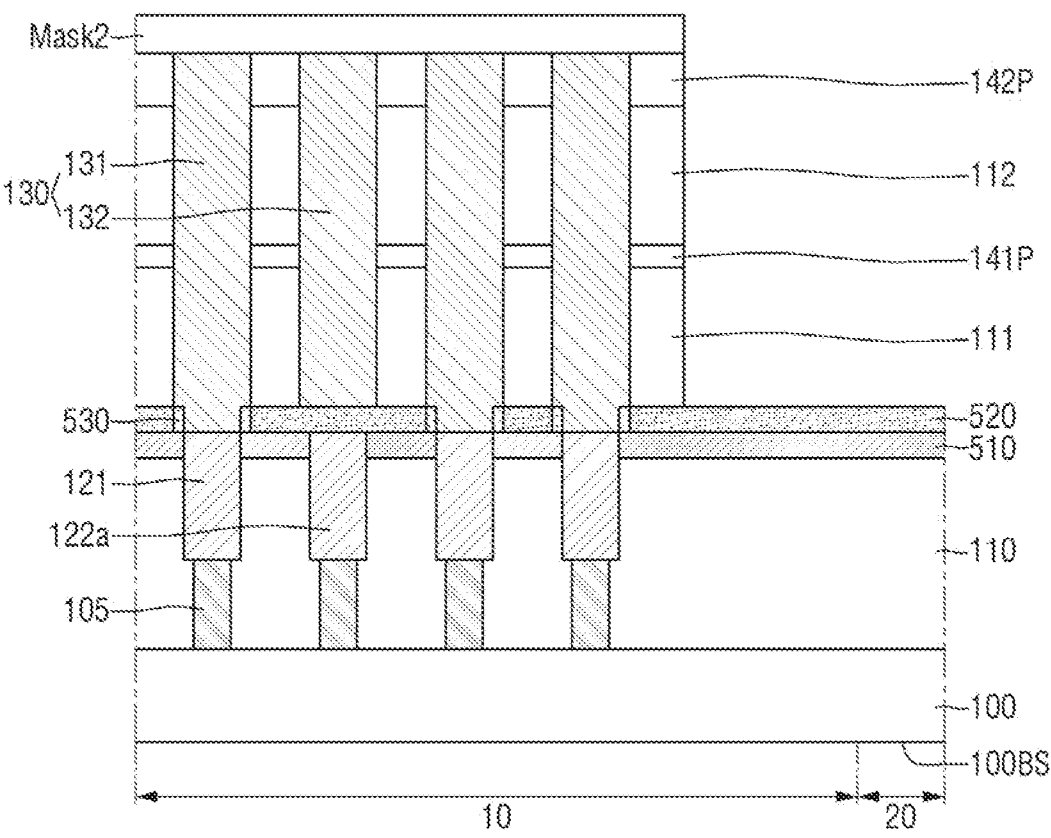

Referring to FIG. 31, the lower mold layer 111, the first pre-support 141P, the upper mold layer 112, and the second pre-support 142P may be partially removed using the second mask Mask2.

In the peripheral area 20, the lower mold layer 111, the first pre-support 141P, the upper mold layer 112, and the second pre-support 142P may all be removed. An etch stop layer 520 may be exposed in the peripheral area 20.

Figure 32:
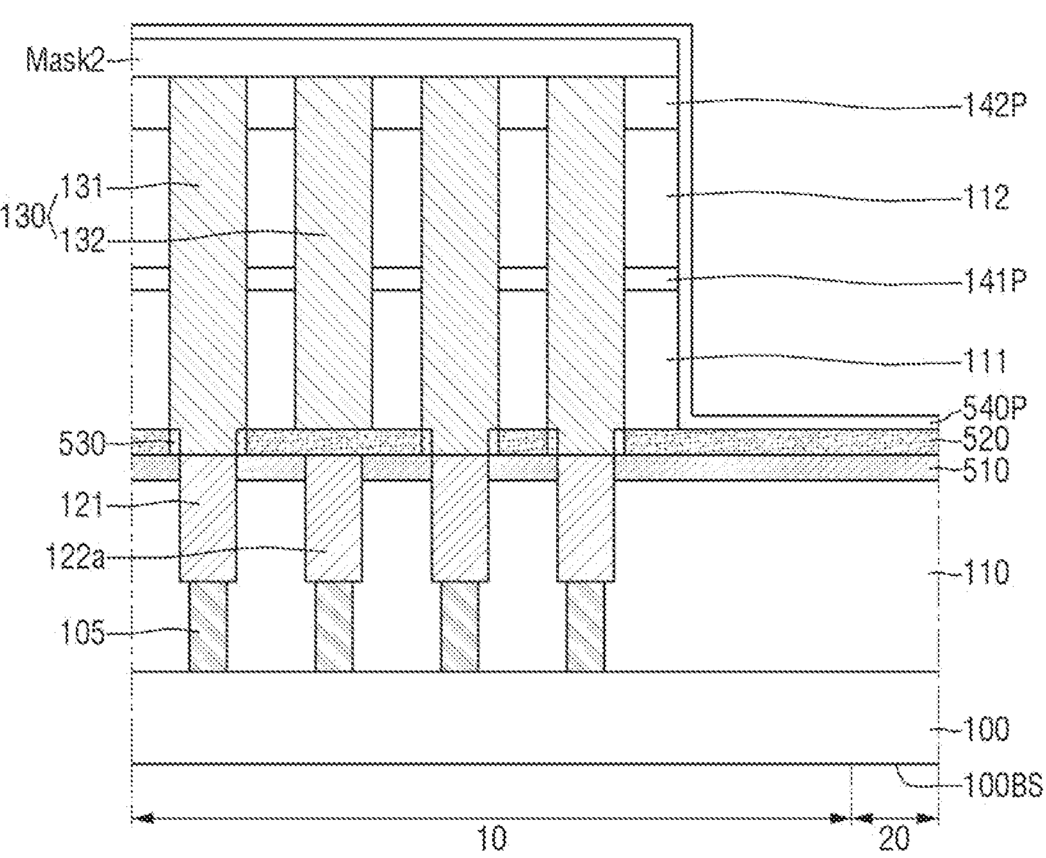

Referring to FIG. 32, a third pre-oxide layer 540P may be formed.

The third pre-oxide layer 540P may be formed on the second mask Mask2, the lower mold layer 111, the first pre-support 141P, the upper mold layer 112, the second pre-support 142P, and the etch stop layer 520. The third pre-oxide layer 540P may extend along the profile of the second mask Mask2, the lower mold layer 111, the first pre-support 141P, the upper mold layer 112, the second pre-support 142P, and the etch stop layer 520.

Figure 33:
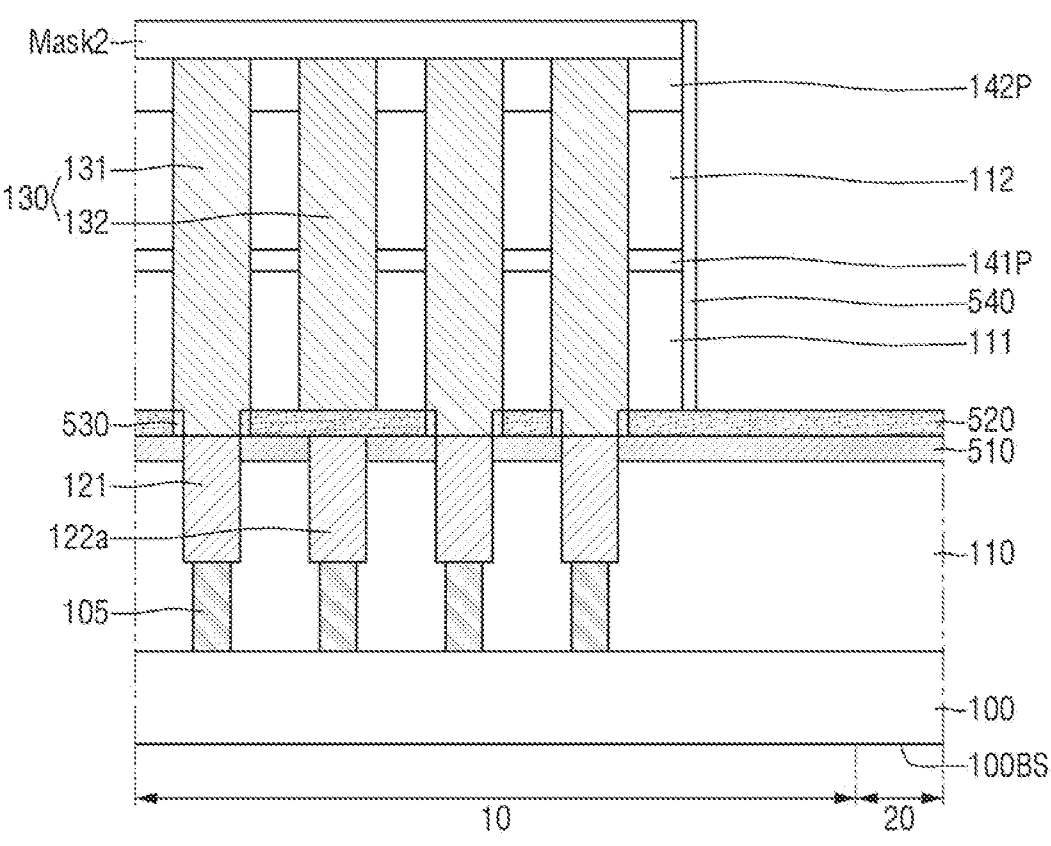

Referring to FIG. 33, a third oxide layer 540 may be formed.

For example, referring to FIGS. 32 and 33, a portion of the third pre-oxide layer 540P which is formed on the second mask Mask2 and the etch stop layer 520 may be removed. The third oxide layer 540 may be formed on sidewalls of the second mask Mask2, the lower mold layer 111, the first pre-support 141P, the upper mold layer 112, and the second pre-support 142P.

Figure 34:
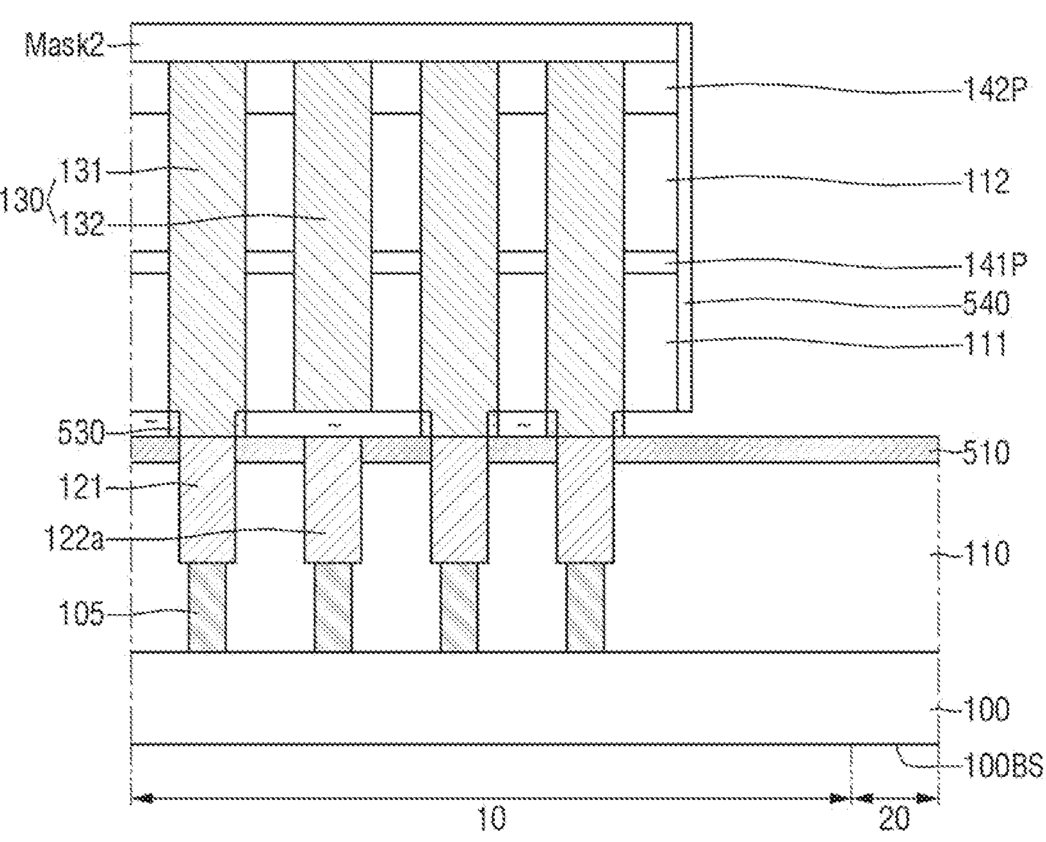

Referring to FIG. 34, the etch stop layer 520 may be removed.

The etch stop layer 520 that is not covered by the third oxide layer 540 in the cell pattern area 10 and the peripheral area 20 may be removed. In plan view, portions of the etch stop layer 520 disposed between the lower electrodes 130 may be connected to each other. Therefore, the etch stop layer 520 disposed between the lower electrodes 130 in the cell pattern area 10 may all be removed using the etch stop layer 520 exposed in the peripheral area 20. The etch stop layer 520 may be removed using, for example, a radical dry cleaning process.

In some embodiments of the present inventive concept, the etch stop layer 520 including SiB may be selectively removed with respect to a first oxide layer 510, the second oxide layer 530, the third oxide layer 540, the lower mold layer 111 and the upper mold layer 112, which include silicon oxide, and the first pre-support 141P and the second pre-support 142P, which include silicon nitride.

Figure 35:
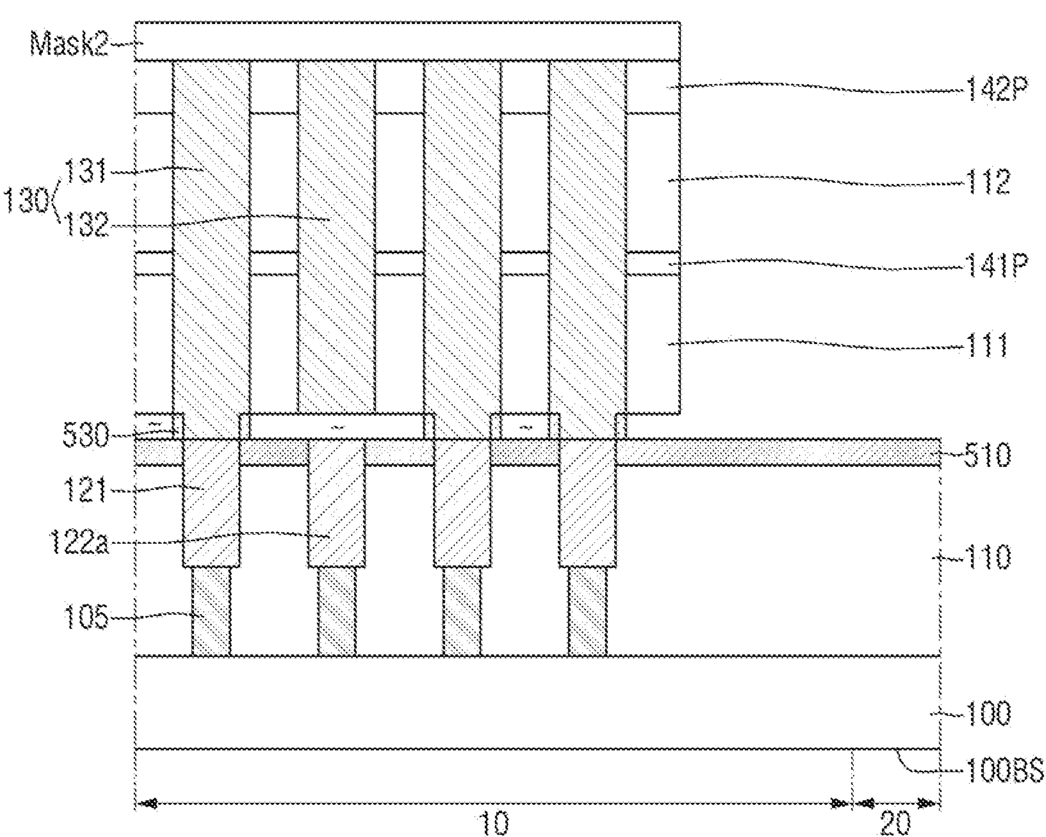

Referring to FIG. 35, the third oxide layer 540 may be removed.

The third oxide layer 540 may be removed using, for example, hafnium (HF).

Figure 36:
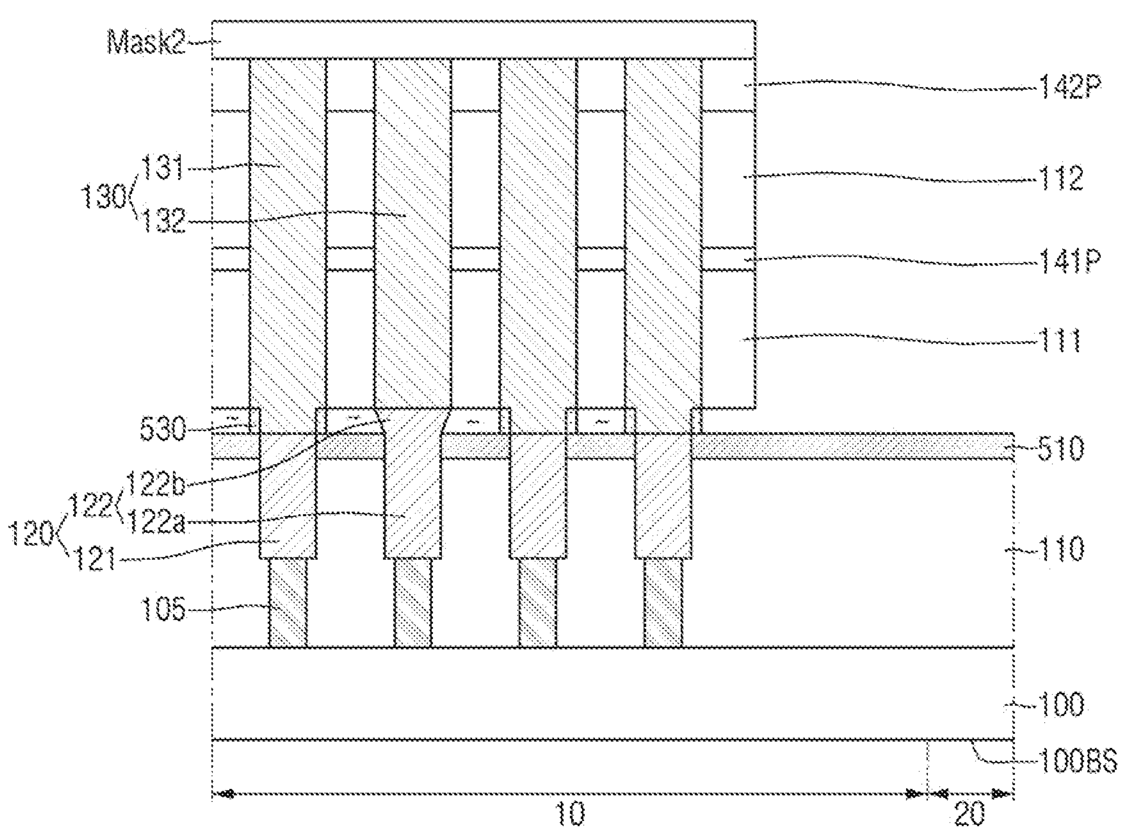

Referring to FIG. 36, a connection portion 122*b* and a second landing pad 122 may be formed.

The connection portion 122*b* may connect an extension portion 122*a* and a second lower electrode 132 to each other. The connection portion 122*b* may be selectively formed only between a lower surface of the second lower electrode 132 and an upper surface of the extension portion 122*a*. The connection portion 122*b* might not be formed on the first oxide layer 510, the lower mold layer 111, and the second oxide layer 530.

For example, referring to FIGS. 35 and 36, the second lower electrode 132 and the extension portion 122*a* may be at least partially surrounded by the lower mold layer 111, the first oxide layer 510, and the second oxide layer 530. In some embodiments of the present inventive concept, the connection portion 122*b* including tungsten (W) may be formed only on the second lower electrode 132 including titanium nitride (TiN) and the extension portion 122*a* including tungsten (W). In some embodiments of the present inventive concept, the connection portion 122*b* including tungsten (W) might not be formed on the lower mold layer 111, the first oxide layer 510 and the second oxide layer 530 including silicon oxide.

The connection portion 122*b* might not be formed on side surfaces of the second lower electrode 132 at least partially surrounded by the lower mold layer 111, the first pre-support 141P, the upper mold layer 112, and the second pre-support 142P.

Figure 37:
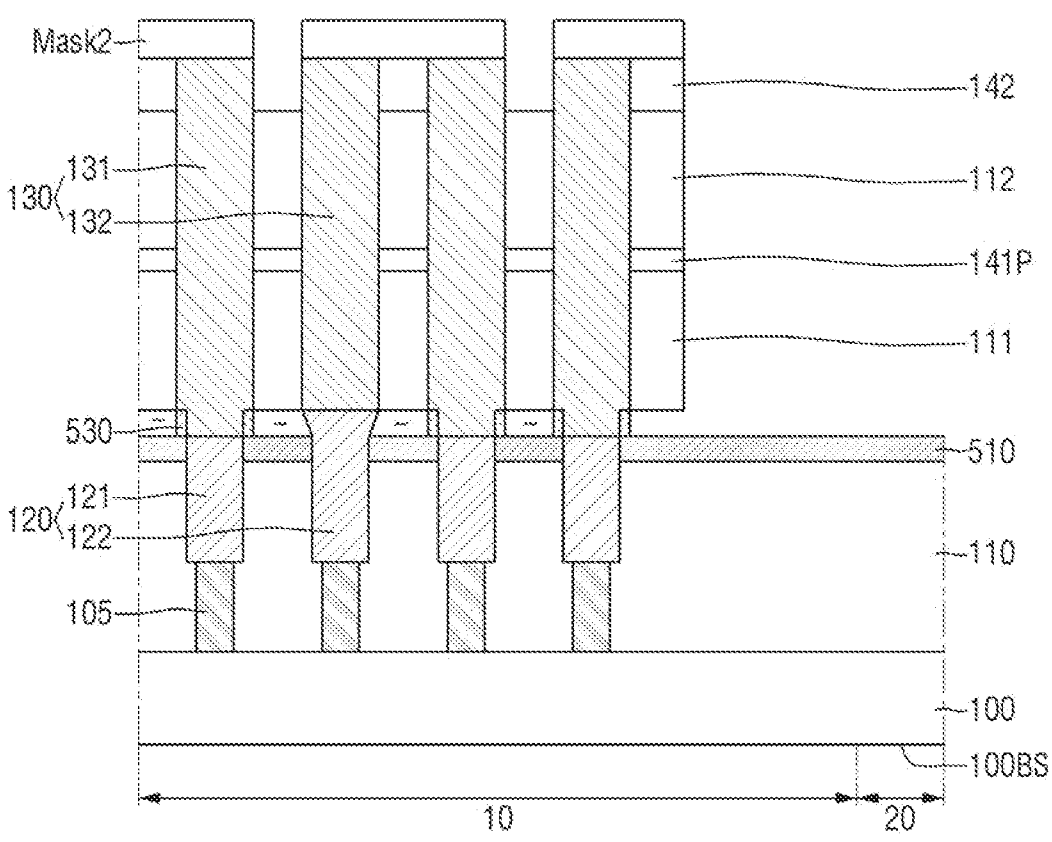

Referring to FIG. 37, the second mask Mask2 may be patterned. Then, a second support 142 may be formed using the second mask Mask2.

The second mask Mask2 may be patterned by removing a portion of the second mask Mask2. The second support 142 may be formed by removing a portion of the second pre-support 142P using the patterned second mask Mask2. The second support 142 may connect adjacent lower electrodes 130.

The upper mold layer 112 may be exposed by the patterned second mask Mask2 and the second support 142.

Figure 38:
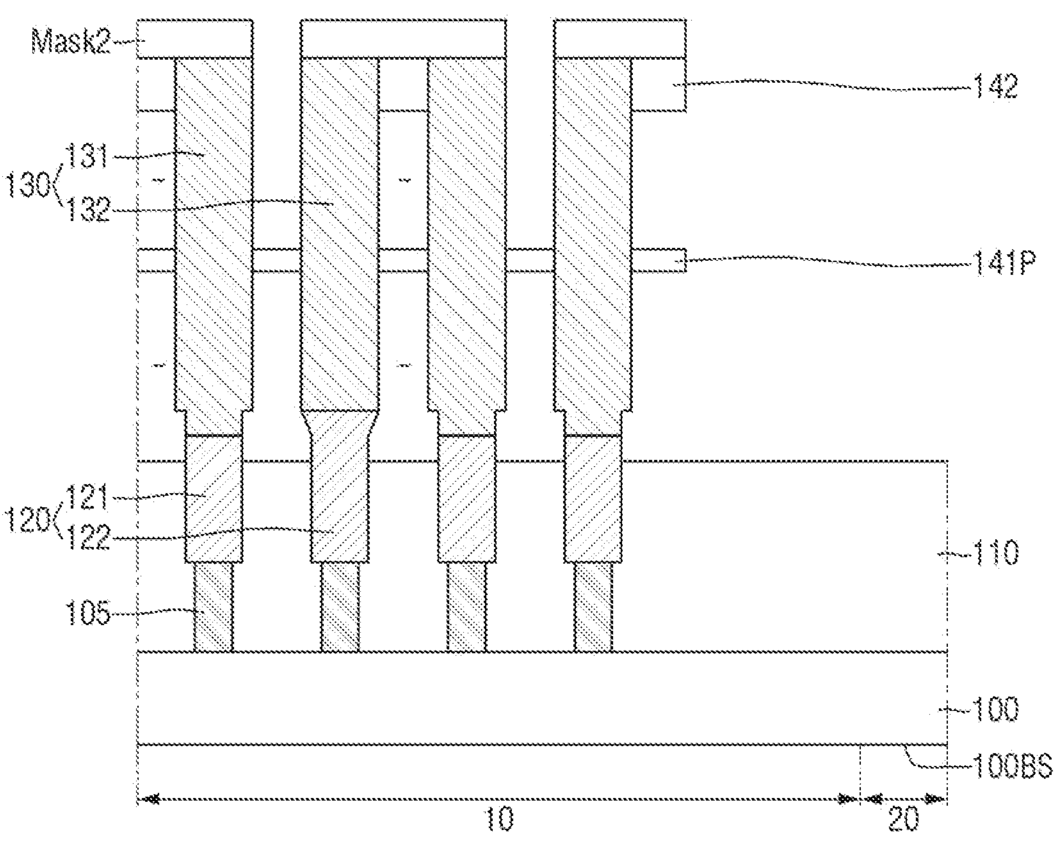

Referring to FIG. 38, the first oxide layer 510, the second oxide layer 530, the lower mold layer 111, and the upper mold layer 112 may be removed.

A space may be formed between the second support 142 and the first pre-support 141P. The first pre-support 141P may connect all of the lower electrodes 130 to each other.

Figure 39:
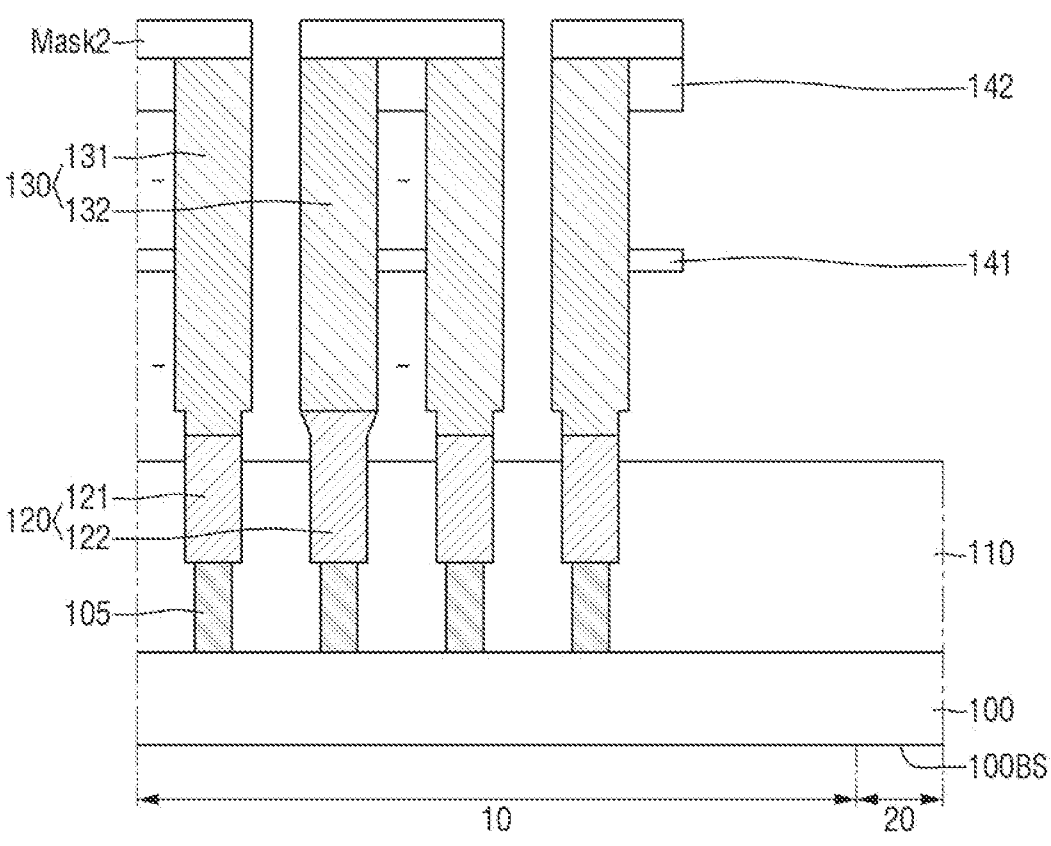

Referring to FIG. 39, a first support 141 may be formed.

The first support 141 may be formed by removing a portion of the first pre-support 141P using the second mask Mask2. The first support 141 may connect adjacent lower electrodes 130.

Next, referring to FIGS. 2 and 27, the second mask Mask2 may be removed, and a capacitor dielectric layer 160 and an upper electrode 170 may be formed.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:

a substrate comprising an active area;

a first landing pad connected to the active area and disposed on the substrate;

a second landing pad connected to the active area, and spaced apart from the first landing pad, wherein the second landing pad is disposed on the substrate;

a first lower electrode disposed on the first landing pad and extending in a direction substantially perpendicular to the substrate;

a second lower electrode disposed on the second landing pad and extending in the direction substantially perpendicular to the substrate;

a dielectric layer extending along the first lower electrode and the second lower electrode; and an upper electrode disposed on the dielectric layer, wherein a first upper surface of the first landing pad is disposed below a second upper surface of the second landing pad with respect to a lower surface of the substrate, and wherein the dielectric layer further extends along portions of side surfaces of the first landing pad and the second landing pad.

2. The semiconductor device of claim 1, wherein a first lower surface of the first lower electrode is disposed below a second lower surface of the second lower electrode with respect to the lower surface of the substrate.

3. The semiconductor device of claim 1, wherein the first lower electrode has a first width at a first point and has a second width, which is greater than the first width, at a second point, wherein the second point is disposed above the first point with respect to the lower surface of the substrate.

4. The semiconductor device of claim 1, further comprising an insulating pattern disposed between the first landing pad and the second landing pad, wherein an upper surface of the insulating pattern is disposed below the upper surface of the first landing pad with respect to the lower surface of the substrate.

5. The semiconductor device of claim 4, wherein the dielectric layer extends along the upper surface of the insulating pattern.

6. The semiconductor device of claim 1, wherein a lowermost surface of the dielectric layer is disposed below each of the upper surface of the first landing pad and the upper surface of the second landing pad with respect to on the lower surface of the substrate.

7. The semiconductor device of claim 1, wherein a lower surface of the upper electrode is disposed below the upper surface of the second landing pad with respect to the lower surface of the substrate.

8. The semiconductor device of claim 1, wherein a first material included in each of the first landing pad and the second landing pad is different from a second material included in each of the first lower electrode and the second lower electrode.

9. The semiconductor device of claim 1, further comprising an electrode support disposed on a sidewall of the first lower electrode and a sidewall of the second lower electrode and supporting the first lower electrode and the second lower electrode.

10. The semiconductor device of claim 1, further comprising:

a first liner extending along side surfaces of the first lower electrode; and a second liner extending along side surfaces of the second lower electrode.

11. The semiconductor device of claim 10, wherein each of the first liner and the second liner comprises the material included in the second landing pad.

12. A semiconductor device comprising:

a substrate comprising an active area;

a first landing pad connected to the active area and disposed on the substrate;

a second landing pad connected to the active area, and spaced apart from the first landing pad, wherein the second landing pad is disposed on the substrate;

an insulating pattern disposed between the first landing pad and the second landing pad;

a first lower electrode disposed on the first landing pad and extending in a direction substantially perpendicular to the substrate;

a second lower electrode disposed on the second landing pad and extending in the direction substantially perpendicular to the substrate;

a dielectric layer extending along the first lower electrode and the second lower electrode; and an upper electrode disposed on the dielectric layer, wherein the first landing pad and the second landing pad protrude above an upper surface of the insulating pattern with respect to a lower surface of the substrate, and the dielectric layer extends along portions of side surfaces of the first landing pad and the second landing pad that protrude above the upper surface of the insulating pattern.

13. The semiconductor device of claim 12, wherein the dielectric layer extends along the upper surface of the insulating pattern.

14. The semiconductor device of claim 12, wherein a first lower surface of the first lower electrode is disposed below a second lower surface of the second lower electrode with respect to the lower surface of the substrate.

15. The semiconductor device of claim 12, wherein the first lower electrode comprises:

a first portion disposed below an upper surface of the second landing pad; and a second portion disposed above the upper surface of the second landing pad and disposed on the first portion, wherein a width of the first portion is smaller than a portion of the second portion.

16. The semiconductor device of claim 12, wherein an upper surface of the second landing pad is disposed above an upper surface of the first landing pad with respect to the lower surface of the substrate.

17. The semiconductor device of claim 12, wherein a lowermost surface of the dielectric layer is disposed below each of a lower surface of the first lower electrode and a lower surface of the second lower electrode with respect to the lower surface of the substrate.

18. The semiconductor device of claim 12, further comprising:

a first liner extending along side surfaces of the first lower electrode; and a second liner extending along side surfaces of the second lower electrode.

19. The semiconductor device of claim 12, wherein each of the first lower electrode and the second lower electrode comprises titanium nitride (TiN), and each of the first landing pad and the second landing pad comprises tungsten (W).

20. A semiconductor device comprising:

a gate trench disposed in a substrate;

a gate electrode filling a portion of the gate trench;

a storage contact disposed on at least one side of the gate electrode and connected to the substrate;

a first landing pad disposed on the storage contact;

a second landing pad disposed on the storage contact and spaced apart from the first land pad;

a first lower electrode disposed on the first landing pad and extending in a direction substantially perpendicular to the substrate;

a second lower electrode disposed on the second landing pad and extending in the direction substantially perpendicular to the substrate;

an insulating pattern disposed between the first landing pad and the second landing pad;

an electrode support spaced apart from the insulating pattern, and disposed on a sidewall of the first lower electrode and a sidewall of the second lower electrode, wherein the electrode support supports the first lower electrode and the second lower electrode;

a dielectric layer extending along the first lower electrode, the second lower electrode, the insulating pattern and the electrode support; and an upper electrode disposed on the dielectric layer, wherein an upper surface of the first landing pad and an upper surface of the second landing pad are at different heights from each other with respect to a lower surface of the substrate, and wherein the dielectric layer further extends along portions of side surfaces of the first landing pad and the second landing pad.

* * * * *